US012028188B2

(12) United States Patent
Yu et al.

(10) Patent No.: US 12,028,188 B2
(45) Date of Patent: Jul. 2, 2024

(54) DIGITAL PREDISTORTION WITH HYBRID BASIS-FUNCTION-BASED ACTUATOR AND NEURAL NETWORK

(71) Applicant: Analog Devices, Inc., Wilmington, MA (US)

(72) Inventors: Tao Yu, Somerville, MA (US); Cristobal Alessandri, Boston, MA (US); Wenjie Lu, Arlington, MA (US)

(73) Assignee: Analog Devices, Inc., Wilmington, MA (US)

( * ) Notice: Subject to any disclaimer, the term of this patent is extended or adjusted under 35 U.S.C. 154(b) by 0 days.

(21) Appl. No.: 17/732,764

(22) Filed: Apr. 29, 2022

(65) Prior Publication Data
US 2022/0368571 A1    Nov. 17, 2022

Related U.S. Application Data

(60) Provisional application No. 63/187,536, filed on May 12, 2021.

(51) Int. Cl.
*H04L 25/02* (2006.01)
*H04L 25/03* (2006.01)
(Continued)

(52) U.S. Cl.
CPC .... *H04L 25/0254* (2013.01); *H04L 25/03165* (2013.01); *H04L 25/49* (2013.01); *H04L 27/367* (2013.01)

(58) Field of Classification Search
CPC ........... H04L 25/0254; H04L 25/03165; H04L 25/49; H04L 27/367; H04L 25/03343;
(Continued)

(56) References Cited

U.S. PATENT DOCUMENTS 8,326,239 B1   12/2012   Peiris et al.
9,160,280 B1   10/2015   Abdelhafiz et al.
(Continued)

FOREIGN PATENT DOCUMENTS

EP   2538553 A1   12/2012
EP   3133734 B1   6/2018
(Continued)

OTHER PUBLICATIONS

International Search Report and Written Opinion in PCT/US2022/028294, mailed Aug. 26, 2022, 9 pages.
(Continued)

*Primary Examiner* — Dac V Ha
(74) *Attorney, Agent, or Firm* — ARENTFOX SCHIFF LLP

(57) ABSTRACT

Systems, devices, and methods related to hybrid basis function, neural network-based digital predistortion (DPD) are provided. An example apparatus for a radio frequency (RF) transceiver includes a digital predistortion (DPD) actuator to receive an input signal associated with a nonlinear component of the RF transceiver and output a predistorted signal. The DPD actuator includes a basis-function-based actuator to perform a first DPD operation using a set of basis functions associated with a first nonlinear characteristic of the nonlinear component. The DPD actuator further includes a neural network-based actuator to perform a second DPD operation using a first neural network associated with a second nonlinear characteristic of the nonlinear component. The predistorted signal is based on a first output signal of the basis-function-based actuator and a second output signal of the neural network-based actuator.

20 Claims, 10 Drawing Sheets

(51) Int. Cl.
*H04L 25/49* (2006.01)
*H04L 27/36* (2006.01)

(58) Field of Classification Search
CPC ....... H03F 2200/451; H03F 2201/3227; H03F 1/3247; H03F 3/195; H04B 1/62
See application file for complete search history.

(56) References Cited

U.S. PATENT DOCUMENTS

| | | |
|---|---|---|
| 10,320,340 B1 | 6/2019 | Pratt et al. |
| 10,469,109 B2 | 11/2019 | Gutman et al. |
| 10,581,469 B1 * | 3/2020 | O'Shea .................... G06N 3/04 |
| 11,018,704 B1 | 5/2021 | O'Shea et al. |
| 11,648,962 B1 | 5/2023 | Crego et al. |
| 2013/0243122 A1 * | 9/2013 | Bai ...................... H03F 1/3247 330/149 |
| 2015/0103952 A1 | 4/2015 | Wang et al. |
| 2016/0285485 A1 | 9/2016 | Fehri et al. |
| 2017/0047952 A1 | 2/2017 | Kim et al. |
| 2017/0085281 A1 | 3/2017 | Dou et al. |
| 2019/0026639 A1 | 1/2019 | Vasudevan et al. |
| 2019/0348956 A1 | 11/2019 | Megretski et al. |
| 2020/0259465 A1 | 8/2020 | Wu et al. |
| 2020/0382147 A1 | 12/2020 | Menkhoff et al. |
| 2021/0110272 A1 | 4/2021 | Guo et al. |
| 2021/0218414 A1 | 7/2021 | Malhotra et al. |
| 2021/0284184 A1 | 9/2021 | Song et al. |
| 2021/0295163 A1 | 9/2021 | Zoph et al. |
| 2021/0391832 A1 * | 12/2021 | Barbu .................... H03F 1/3247 |
| 2022/0200540 A1 * | 6/2022 | Kof ....................... H03F 1/3247 |
| 2022/0255786 A1 * | 8/2022 | McCormick ............. H03F 3/68 |
| 2022/0383859 A1 | 12/2022 | Mimassi |
| 2023/0006611 A1 | 1/2023 | Chen et al. |
| 2023/0033203 A1 * | 2/2023 | Liu ......................... H03F 3/195 |
| 2023/0268942 A1 * | 8/2023 | Ghannouchi .......... H04B 10/00 375/297 |

FOREIGN PATENT DOCUMENTS

| | | |
|---|---|---|
| KR | 101058733 B1 | 8/2011 |
| KR | 1020210050961 A | 5/2021 |
| WO | 2019233558 A1 | 12/2019 |

OTHER PUBLICATIONS

Rawat et al., "Adaptive Digital Predistortion of Wireless Power Amplifiers/Transmitters Using Dynamic Real-Value Focused Time-Delay Line Neural Networks," IEEE Transactions on Microwave Theory and Techniques, Nov. 24, 2009, vol. 58, Issue 1, pp. 95-104.
International Search Report and Written Opinion in PCT/US2022/028292, mailed Aug. 29, 2022, 14 pages.
International Search Report and Written Opinion in PCT/US2022/028293, mailed Aug. 12, 2022, 8 pages.
U.S. Notice of Allowance issued in U.S. Appl. No. 17/732,809 on May 31, 2023, 10 pages.

* cited by examiner

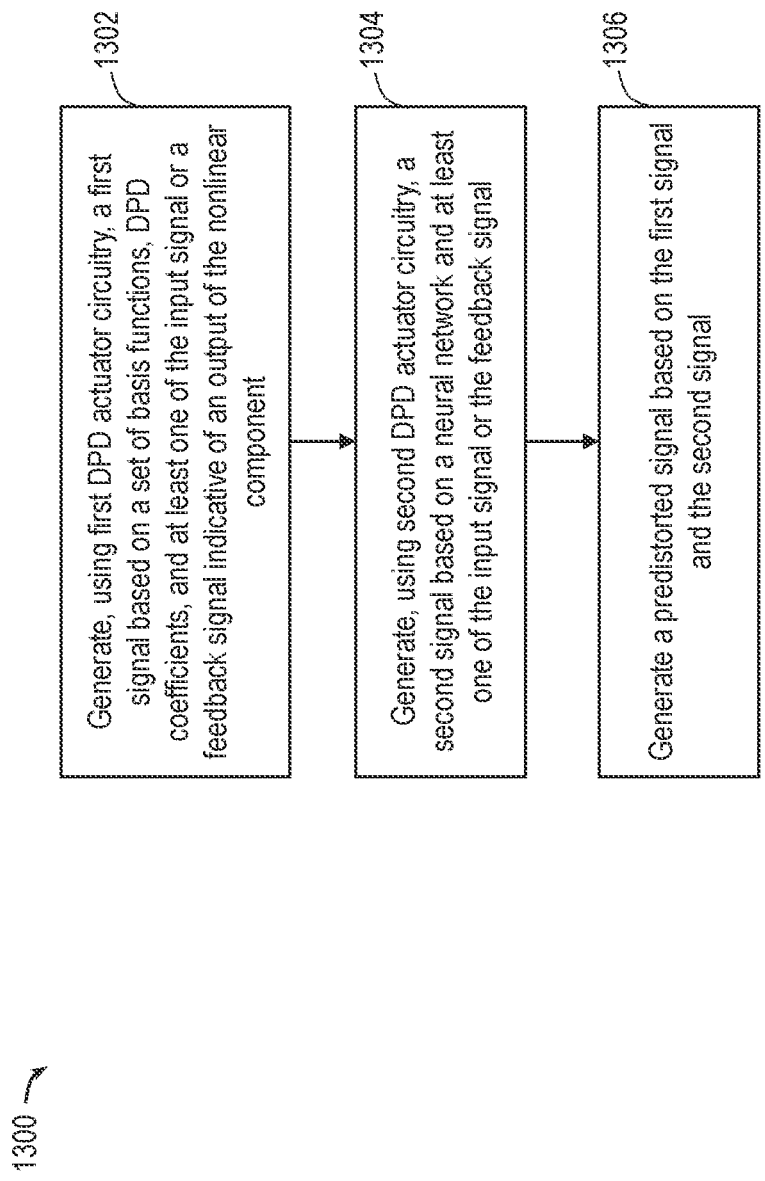

DIGITAL PREDISTORTION WITH HYBRID BASIS-FUNCTION-BASED ACTUATOR AND NEURAL NETWORK

CROSS REFERENCE TO RELATED APPLICATIONS

The present application claims priority to and the benefit of the U.S. Provisional Patent Application No. 63/187,536 entitled "DIGITAL PREDISTORTION FOR POWER AMPLIFIER LINEARIZATION USING NEURAL NETWORKS" and filed May 12, 2021, which is hereby incorporated by reference in its entirety as if fully set forth below and for all applicable purposes.

TECHNICAL FIELD OF THE DISCLOSURE

The present disclosure generally relates to electronics, and more particularly to digital predistortion (DPD) with hybrid basis-function-based actuator and neural network(s).

BACKGROUND

Radio frequency (RF) systems are systems that transmit and receive signals in the form of electromagnetic waves in the RF range of approximately 3 kilohertz (kHz) to 300 gigahertz (GHz). RF systems are commonly used for wireless communications, with cellular/wireless mobile technology being a prominent example, but may also be used for cable communications such as cable television. In both of these types of systems, linearity of various components therein plays a crucial role.

Linearity of an RF component or a system such as an RF transceiver is easy to understand in theory. Namely, linearity generally refers to the ability of a component or a system to provide an output signal that is directly proportional to an input signal. In other words, if a component or a system is perfectly linear, the relationship of a ratio of the output signal to the input signal is a straight line. Achieving this behavior in real-life components and systems is far more complicated and many challenges to linearity must be resolved, often at the expense of some other performance parameter, such as efficiency and/or output power.

Made from semiconductor materials, which are inherently nonlinear, and having to operate at relatively high power levels, power amplifiers (PAs) are usually the first components to analyze when considering a design of an RF system in terms of linearity. PA outputs with nonlinear distortions can result in reduced modulation accuracy (e.g., reduced error vector magnitude (EVM)) and/or out-of-band emissions. Therefore, both wireless RF systems (e.g., Long-Term Evolution (LTE) and millimeter-wave or 5th generation (5G) systems) and cable RF systems have stringent specifications on PA linearity.

DPD can be applied to enhance linearity of a PA. Typically, DPD involves applying, in the digital domain, predistortion to a signal to be provided as an input to a PA to reduce and/or cancel distortion that is expected to be caused by the PA. The predistortion can be characterized by a PA model. The PA model can be updated based on the feedback from the PA (i.e., based on the output of the PA). The more accurate a PA model is in terms of predicting the distortions that the PA will introduce, the more effective the predistortion of an input to the PA will be in terms of reducing the effects of the distortion caused by the amplifier.

Performing DPD in RF systems is not an easy task because a variety of factors can affect the cost, quality and robustness of DPD. Physical constraints such as space/surface area and also regulations can pose further constraints to the requirements or specifications of DPD. DPD becomes particularly challenging because of ever-increasing sampling rates used in state-of-the-art RF systems, and thus trade-off and ingenuity have to be exercised in designing DPD.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which:

FIG. 13 provides a flow diagram illustrating a method for performing hybrid basis function, neural network-based DPD, according to some embodiments of the present disclosure.

DESCRIPTION OF EXAMPLE EMBODIMENTS OF THE DISCLOSURE

Overview

Figure 1:
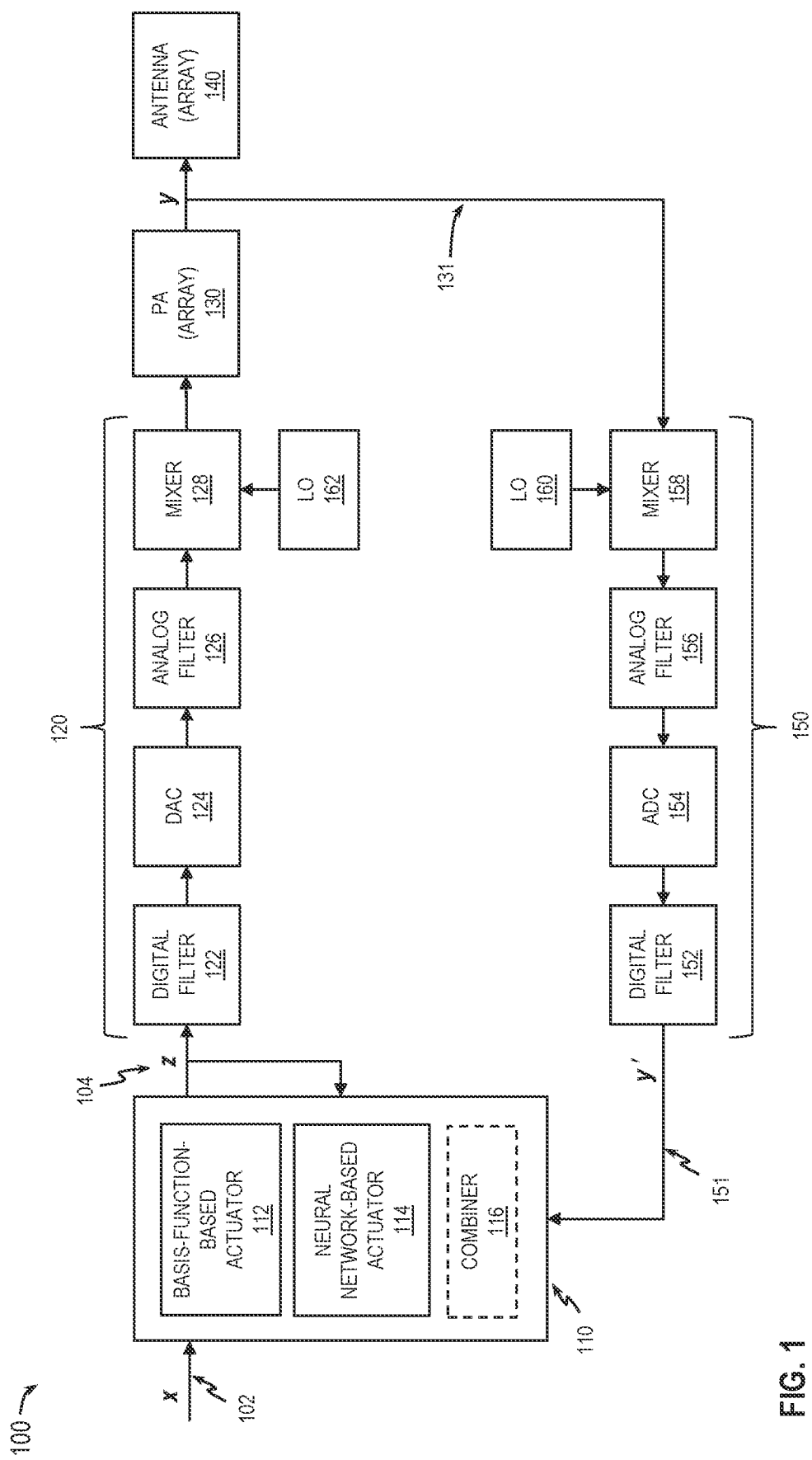
FIG. 1 provides a schematic block diagram of an exemplary radio frequency (RF) transceiver in which hybrid basis function, neural network-based digital predistortion (DPD) may be implemented, according to some embodiments of the present disclosure.

The systems, methods and devices of this disclosure each have several innovative embodiments, no single one of which is solely responsible for all of the desirable attributes disclosed herein. Details of one or more implementations of the subject matter described in this specification are set forth in the description below and the accompanying drawings.

For purposes of illustrating DPD using neural networks, proposed herein, it might be useful to first understand phenomena that may come into play in RF systems. The following foundational information may be viewed as a basis from which the present disclosure may be properly explained. Such information is offered for purposes of explanation only and, accordingly, should not be construed in any way to limit the broad scope of the present disclosure and its potential applications.

As described above, PAs are usually the first components to analyze when considering a design of an RF system in terms of linearity. Having linear and efficient PAs is essential for wireless and cable RF systems. While linearity is also important for small-signal amplifiers such as low-noise amplifiers, the challenges of linearity are particularly pronounced for PAs because such amplifiers are typically required to produce relatively high levels of the output power and are, therefore, particularly susceptible to entering certain operating conditions where nonlinear behavior can no longer be ignored. On one hand, the nonlinear behavior of semiconductor materials used to form amplifiers tends to worsen when the amplifiers operate on signals with high power levels (an operating condition commonly referred to as "operating in saturation"), increasing the amount of nonlinear distortions in their output signals, which is highly undesirable. On the other hand, amplifiers operating at relatively high power levels (i.e., operating in saturation) also typically function at their highest efficiency, which is highly desirable. As a result, linearity and efficiency (or power level) are two performance parameters for which, often, an acceptable trade-off has to be found in that an improvement in terms of one of these parameters comes at the expense of the other parameter being suboptimal. To that end, the term "back-off" is used in the art to describe a measure of how far the input power (i.e., the power of a signal provided to the amplifier to be amplified) should be reduced in order to realize the desired output linearity (e.g., back-off may be measured as a ratio between the input power that delivers maximum power to the input power that delivers the desired linearity). Thus, reducing the input power may provide an improvement in terms of linearity but results in a decreased efficiency of the amplifier.

As also described above, DPD can predistort an input to a PA to reduce and/or cancel distortion caused by the amplifier. To realize this functionality, at a high level, DPD involves forming a model of how a PA may affect an input signal, the model defining coefficients of a filter to be applied to the input signal (such coefficients referred to as "DPD coefficients") in an attempt to reduce and/or cancel distortions of the input signal caused by the amplifier. In this manner, DPD will try to compensate for the amplifier applying an undesirable nonlinear modification to the signal to be transmitted, by applying a corresponding modification to the input signal to be provided to the amplifier.

Models used in DPD algorithms are typically adaptive models, meaning that they are formed in an iterative process by gradually adjusting the coefficients based on the comparison between the data that comes into the input to the amplifier and the data that comes out from the output of the amplifier. Estimation of DPD coefficients is based on acquisition of finite sequences of input and output data (i.e., input to and output from a PA), commonly referred to as "captures," and formation of a feedback loop in which the model is adapted based on the analysis of the captures. More specifically, conventional DPD algorithms are based on General Memory Polynomial (GMP) models that involve forming a set of polynomial equations commonly referred to as "update equations," and searching for suitable solutions to the equations, in a broad solution space, to update a model of the PA. To that end, DPD algorithms solve an inverse problem, which is the process of calculating, from a set of observations, the casual factors that produced these observations.

Solving inverse problems in the presence of nonlinear effects can be challenging and may be ill-posed. In particular, inventors of the present disclosure realized that GMP-based PA models may have limitations due to signal dynamics and limited memory depth required to store polynomial data, especially in presence of the ever-increasing sampling rates used in state-of-the-art RF systems.

Solid-state devices that can be used in high frequency are of great importance in modern semiconductor technologies. Due, in part, to their large band gap and high mobility, III-N based transistors (i.e., transistors that employ compound semiconductor materials with a first sub-lattice of at least one element from group III of the periodic table (e.g., Al, Ga, In) and a second sub-lattice of nitrogen (N) as channel materials), such as GaN based transistors, may be particularly advantageous for high frequency applications. In particular, PAs may be built using GaN transistors.

While GaN transistors have desirable features in terms of cut-off frequency and efficiency, their behavior is complicated by an effect known as charge trapping, where defect sites in the transistor channel trap charge carriers. The density of trapped charges is largely dependent on the gate voltage, where the gate voltage is typically proportional to the signal amplitude. To complicate things further, an opposite effect may simultaneously compete with the effect of charge trapping. Namely, as some charge carriers are trapped by defect sites, other charge carriers are released from the traps, e.g., due to thermal activation. These two effects have vastly different time constants: the defect sites may be filled with trapped charges quickly any time the gate voltage is increased, while the release of trapped charges happens more slowly. The release time constants can be 10's of microseconds and up to milliseconds, with the effect typically being very visible on the time scale of the symbol periods in 4G or 5G data, especially for data that contains bursts.

Various embodiments of the present disclosure provide systems and methods that aim to improve on one or more of the drawbacks described above in providing linear and efficient amplifiers (such as, but not limited to, PAs) for RF systems (such as, but not limited to, wireless RF systems of millimeter-wave/5G technologies). In particular, aspects of the present disclosure provide a DPD arrangement that utilizes a combination of a basis-function-based actuator and a neural network (NN)-based actuator.

As used herein, a basis-function-based actuator may refer to a DPD actuator that performs DPD operation(s) as part of predistorting an input signal to a nonlinear component (e.g., PA) using a set of basis functions. A basis function may refer to an element of a particular basis for a function space. Every function in the function space can be represented as a linear combination of basis functions, just as every vector in a vector space can be represented as a linear combination of basis vectors. Some examples of basis functions may be based on Volterra series, a GMP model (which is a subset of Volterra series), and/or linear piecewise functions.

As used herein, a neural network-based actuator may refer to a DPD actuator that performs DPD operation(s) as part of predistorting an input signal to a nonlinear component (e.g., PA) using one or more neural networks. Neural networks are deep learning models, which are a subset of machine learning. As an example, a neural network may include a plurality of layers, for example, an input layer, followed by one or more hidden layers (e.g., fully-connected layers or convolutional layers) and an output layer. Each layer may include a set of weights and/or biases that can transform inputs received from a previous layer and the resulting outputs can be passed to the next layer. The weights and/or biases in each layer can be trained and adapted, for example, to process an input signal and/or an observed signal or a feedback signal indicative of an output of the nonlinear component, post-process an output signal of a basis-function-based actuator, update parameters of the basis-function-based actuator in predistorting the input signal, and/or combine signals generated by the basis-function-based actuator and the neural network-based actuator. In general, the one or more neural networks used by the neural network-based actuator can have any suitable architecture (e.g., convolutional neural network, recurrent neural network, etc.)

According to an aspect of the present disclosure, an apparatus for a RF transceiver may include a DPD actuator to receive an input signal associated with a nonlinear component (e.g., a PA) of the RF transceiver and output a predistorted signal. The DPD actuator may include a basis-function-based actuator and a neural network-based actuator. The basis-function-based actuator may perform a first DPD operation using a set of basis functions associated with a first nonlinear characteristic of a nonlinear component. In some examples, the set of basis functions can be based on Volterra series, a GMP model, and/or a dynamic deviation reduction (DDR) model. The neural network-based actuator may perform a second DPD operation using one or more neural networks associated with a second nonlinear characteristic of the nonlinear component. The first and second nonlinear characteristics can be the same or different. In general, the first and second nonlinear characteristics can include any suitable order (e.g., $3^{rd}$ order, $5^{th}$ order, $10^{th}$ order, $11^{th}$ order, etc.) of nonlinear characteristics of the nonlinear component and/or any number of nonlinear characteristics. The DPD actuator may output the predistorted signal based on a first output signal of the basis-function-based actuator and a second output signal of the neural network-based actuator. The basis-function-based actuator and the neural network-based actuator can be arranged in a variety of configurations, for example, in a parallel configuration or in a cascaded configuration, and may interact with each other in a variety of ways to produce the predistorted signal.

For the parallel configuration, each of the basis-function-based actuator and the neural network-based actuator may process at least one of the input signal or a feedback signal indicative of an output of the nonlinear component (where the output is looped back from a transmitter path to a receiver path for observation). In this regard, the basis-function-based actuator may perform the first DPD operation by processing at least one of the input signal or the feedback signal using the set of basis functions to generate the first output signal. The neural network-based actuator may perform the second DPD operation by processing at least one of the input signal or the feedback signal using the one or more neural networks to generate the second output signal. Further, in one example, the DPD actuator may further include a combiner to combine the input signal, the first output signal, and/or the second output signal to provide the predistorted signal. The combiner can perform various data transformations (e.g., signal alignment, upsampling, filtering, processing using another neural network, etc.) on the input signal, the first output, and/or the second output signal prior to summing these signals together. In another example, as part of performing the second DPD operation, instead of combining the first and second output signals, the second output signal of the neural network-based actuator can be used to update parameter(s) of the basis-function-based actuator, and the basis-function-based actuator may generate the first output signal further using the updated parameter(s).

For the cascaded configuration, the basis-function-based actuator and the neural network-based actuator may be arranged in series one after another. In one example, the neural network-based actuator may be coupled to the output of the basis-function-based actuator. In this regard, the basis-function-based actuator may perform the first DPD operation by processing at least one of the input signal or a feedback signal indicative of an output of the nonlinear component using the set of basis functions to generate the first output signal. Subsequently, the neural network-based actuator may perform the second DPD operation by processing the first output signal of the basis-function-based actuator using the one or more neural networks to generate the second output signal. In some instances, the neural network-based actuator may generate the second output signal further by processing the input signal using the one or more neural networks. In another example, the basis-function-based actuator may be coupled to the output of the neural network-based actuator. In this regard, the neural network-based actuator may perform the second DPD operation by processing at least one of the input signal or the feedback signal using the one or more neural networks to generate the second output signal. Subsequently, the basis-function-based actuator may perform the first DPD operation by processing the second output signal of the neural network-based actuator using the set of basis functions to generate the first output signal.

In some aspects, for the parallel configuration and/or the cascaded configuration, the basis-function-based actuator and/or the neural network-based actuator may preprocess (e.g., a transformation) their respective inputs as part of the first DPD operation and/or the second DPD operation, respectively. Additionally or alternatively, for the parallel configuration, the neural network-based actuator can further downsample the at least one of the input signal or the feedback signal as part of the second DPD operation.

In some aspects, the one or more neural networks used by the neural network-based actuator for the second DPD operation may include an estimation neural network model and a prediction neural network model. The neural network-based actuator may select between the estimation neural network model or the prediction neural network model based on an availability of the feedback signal. In this regard, when the feedback signal is available or valid, the neural network-based actuator may generate the second output signal by using the estimation neural network model to process the input signal and the feedback signal. On the other hand, when there is a lack of availability of the feedback signal, the neural network-based actuator may generate the second output signal by using the prediction neural network model to process the input signal. Further, in some aspects, the one or more neural networks may have recurrent internal states. In this regard, the neural network-based actuator may generate the second output signal by using the selected one of the estimation neural network model or the prediction neural network model to process the at least one of the input signal or the feedback signal, and further process previous state information associated with at least one of the estimation neural network model or the prediction neural network model. The neural network-based actuator may further update, based on the second output signal, state information associated with at least one of the estimation neural network model or the prediction neural network model.

Further, in some aspects, the neural network-based actuator may include a neural net processor (e.g., a hardware accelerator) to perform neural network-specific operations (e.g., convolutions, rectified linear unit (ReLU) operations, etc.). The neural network-based actuator may further include memory to store parameters (e.g., trained weights) associated with the one or more neural networks (e.g., the estimation neural network model and the prediction neural network model). The neural network-based actuator may utilize the neural net processor to perform the second DPD operation based on the stored parameters.

The systems, schemes, and mechanisms described herein advantageously utilize neural network(s) to assist DPD actuation. For example, using basis functions for DPD may have limitations. Neural network(s) can generally provide a higher degree of freedom than basis functions and can model arbitrary, complex functions that may not be easily represented by analytical or mathematical functions. For example, the neural network-based actuator can model and correct for nonlinear characteristics and/or long-term memory effects that the basis-function-based actuator is not designed to model and/or correct (e.g., due to hardware resource limitations and/or desired utilization) and/or unable to model due to changes (e.g., analog gain settings, temperatures, signal powers, etc.). Further, in contrast to conventional DPD where observation data (e.g., feedback signals that are looped back from the transmitter to the receiver) is used for adaptation only, which can have a long delay on the order of seconds from the time of observation to the time of actuation, the neural network-based actuator disclosed herein can use the observation data for actuation or compensation, which may have a shorter delay on the order of microseconds from the time of observation to the time of actuation. Accordingly, the present disclosure can improve DPD performance in linearizing nonlinear component(s). While aspects of the present disclosure are discussed in the context of linearizing a PA in an RF system, the disclosed hybrid basis function, neural network-based DPD can be applied to linearize any suitable nonlinear component. Further, the disclosed hybrid basis function, neural network-based DPD techniques are suitable for use at wireless base stations and/or at a wireless mobile handset (e.g., user equipment).

Example RF Transceivers with Hybrid Basis Function, Neural Network-Based DPD Arrangement FIG. 1 provides a schematic block diagram of an exemplary RF transceiver 100 in which hybrid basis function, neural network-based DPD may be implemented, according to some embodiments of the present disclosure. As shown in FIG. 1, the RF transceiver 100 may include a DPD circuit 110, a transmitter circuit 120, a PA 130, an antenna 140, and a receiver circuit 150.

The DPD circuit 110 is configured to receive an input signal 102, represented by x, which may be a sequence of digital samples and which may be a vector. In general, as used herein, each of the lower case, bold italics single-letter labels used in the present figures (e.g., labels x, z, y, and y', shown in FIG. 1), refers to a vector. In some embodiments, the input signal 102 $x$ may include one or more active channels in the frequency domain, but, for simplicity, an input signal with only one channel (i.e., a single frequency range of in-band frequencies) is described. In some embodiments, the input signal x may be a baseband digital signal. The DPD circuit 110 is configured to generate an output signal 104, which may be represented by z, based on the input signal 102 $x$. The DPD output signal 104 $z$ may be provided further to the transmitter circuit 120.

According to aspects of the present disclosure, the DPD circuit 110 may include a basis-function-based actuator 112 and a neural network-based actuator 114. The basis-function-based actuator 112 may perform a first DPD operation using a set of basis functions associated with a first nonlinear characteristic of a nonlinear component. In some examples, the set of basis functions can be a Volterra series or a subset of the Volterra series (e.g., GMP and/or DDR). The neural network-based actuator 114 may perform a second DPD operation using one or more neural networks associated with a second nonlinear characteristic of the nonlinear component. The DPD circuit 110 may output the predistorted signal 104 $z$ based on a first output signal of the basis-function-based actuator 112 and a second output signal of the neural network-based actuator 114. In general, the basis-function-based actuator 112 and the neural network-based actuator 114 can be implemented using any suitable combination of hardware and/or software. In certain aspects, the basis-function-based actuator 112 can utilize lookup tables (LUTs) to store the set of basis functions and an associated set of DPD coefficients, which may be represented by c, and the neural network-based actuator 114 can include hardware accelerator (e.g., a neural net processor) for performing neural network operations. The basis-function-based actuator 112 and the neural network-based actuator 114 can be arranged in a variety of configurations, for example, in a parallel configuration or in a cascaded configuration, and may interact with each other in a variety of ways to produce the predistorted signal. In some aspects, the DPD circuit 110 can optionally include a combiner 116 as shown by the dash-lined box, for example, to combine outputs of the basis-function-based actuator 112 and the neural network-based actuator 114 when the basis-function-based actuator 112 and the neural network-based actuator 114 are arranged in a parallel configuration. Mechanisms for performing DPD using the basis-function-based actuator 112 and the neural network-based actuator 114 will be discussed more fully below. In some instances, the DPD circuit 110 may be referred to as a hybrid basis function, neural network-based DPD.

The transmitter circuit 120 may be configured to upconvert the signal 104 z from a baseband signal to a higher frequency signal, such as an RF signal. The RF signal generated by the transmitter 120 may be provided to the PA 130, which may be implemented as a PA array that includes N individual PAs. The PA 130 may be configured to amplify the RF signal generated by the transmitter 120 (thus, the PA 130 may be driven by a drive signal that is based on the output of the DPD circuit 110) and output an amplified RF signal 131, which may be represented by y (e.g., a vector).

In some embodiments, the RF transceiver 100 may be a wireless RF transceiver, in which case it will also include an antenna 140. In context of wireless RF systems, antenna is a device that serves as an interface between radio waves propagating wirelessly through space and electric currents moving in metal conductors used in a transmitter, a receiver, or a transceiver. During transmission, a transmitter circuit of an RF transceiver may supply an electric signal, which signal is amplified by a PA, and an amplified version of the signal is provided to antenna's terminals. The antenna may then radiate the energy from the signal output by the PA as radio waves. Antennas are essential components of all radio equipment, and are used in radio broadcasting, broadcast television, two-way radio, communications receivers, radar, cell phones, satellite communications and other devices.

An antenna with a single antenna element will typically broadcast a radiation pattern that radiates equally in all directions in a spherical wavefront. Phased antenna arrays generally refer to a collection of antenna elements that are used to focus electromagnetic energy in a particular direction, thereby creating a main beam, a process commonly referred to as "beamforming." Phased antenna arrays offer numerous advantages over single antenna systems, such as high gain, ability to perform directional steering, and simultaneous communication. Therefore, phased antenna arrays are being used more frequently in a myriad of different applications, such as mobile/cellular wireless technology, military applications, airplane radar, automotive radar, industrial radar, and Wi-Fi technology.

In the embodiments where the RF transceiver 100 is a wireless RF transceiver, the amplified RF signal 131 y can be provided to the antenna 140, which may be implemented as an antenna array that includes a plurality of antenna elements, e.g., N antenna elements. The antenna 140 is configured to wirelessly transmit the amplified RF signal 131 y.

In the embodiments where the RF transceiver 100 is a wireless RF transceiver of a phased antenna array system, the RF transceiver 100 may further include a beamformer arrangement, configured to vary the input signals provided to the individual PAs of the PA array 130 to steer the beam generated by the antenna array 140. Such a beamformer arrangement is not specifically shown in FIG. 1 because it may be implemented in different manners, e.g., as an analog beamformer (i.e., where the input signals to be amplifier by the PA array 130 are modified in the analog domain, i.e., after these signals have been converted from the digital domain to the analog domain), as a digital beamformer (i.e., where the input signals to be amplifier by the PA array 130 are modified in the digital domain, i.e., before these signals are converted from the digital domain to the analog domain), or as a hybrid beamformer (i.e., where the input signals to be amplifier by the PA array 130 are modified partially in the digital domain and partially in the analog domain).

Ideally, the amplified RF signal 131 y from the PA 130 should just be an upconverted and amplified version of the output of the transmitter circuit 120, e.g., an upconverted, amplifier, and beamformed version of the input signal 102 x. However, as discussed above, the amplified RF signals 131 y can have distortions outside of the main signal components. Such distortions can result from nonlinearities in the response of the PA 130. As discussed above, it can be desirable to reduce such nonlinearities. Accordingly, the RF transceiver 100 may further include a feedback path (or observation path) that allows the RF transceiver to analyze the amplified RF signal 131 y from the PA 130 (in the transmission path). In some embodiments, the feedback path may be realized as shown in FIG. 1A, where a feedback signal 151 y' may be provided from the PA 130 to the receiver circuit 150. However, in other embodiments, the feedback signal may be a signal from a probe antenna element configured to sense wireless RF signals transmitted by the antenna 140 (not specifically shown in FIG. 1A).

Thus, in various embodiments, at least a portion of the output of the PA 130 or the output of the antenna 140 may be provided, as a feedback signal 151, to the receiver circuit 150. The output of the receiver circuit 150 is coupled to the DPD circuit 110, in particular, to the basis-function-based actuator 112 and/or the neural network-based actuator 114. In this manner, an output signal 151 (y') of the receiver circuit 150, which is of the output signal 131 (y) from the PA 130, may be provided to the basis-function-based actuator 112 and/or the neural network-based actuator 114 by way of the receiver circuit 150. As discussed above, the basis-function-based actuator 112 and the neural network-based actuator 114 can be arranged in a parallel configuration or a cascaded configuration. For the parallel configuration, each of the basis-function-based actuator 112 and the neural network-based actuator 114 may process at least one the input signal 102 x or the feedback signal 151 y'. For the cascaded configuration, the basis-function-based actuator 112 and the neural network-based actuator 114 may be arranged in series one after another, and one of the basis-function-based actuator 112 and the neural network-based actuator 114 may process at least one the input signal 102 x or the feedback signal 151 y' to generate a first output signal and the other one of the basis-function-based actuator 112 and the neural network-based actuator 114 processing the first output signal of the basis-function-based actuator using the one or more neural networks to generate a second output signal. Details of the parallel configuration and the cascaded configuration are discuss more fully below with reference to FIGS. 2-5. In some instances, the DPD circuit 110 can optionally include a DPD adaptation circuit to process the received signals (e.g., the input signal 102 x and/or the feedback signal 151 y') to update DPD coefficients c applied by the DPD actuator circuit 112 to the input signal 102 x to generate the actuator output 104 z. A signal based on the actuator output z is provided as an input to the PA 130, meaning that the DPD actuator output z may be used to control the operation of the PA 130.

As further shown in FIG. 1, in some embodiments, the transmitter circuit 120 may include a digital filter 122, a digital-to-analog converter (DAC) 124, an analog filter 126, and a mixer 128. In such a transmitter, the predistorted signal 104 z may be filtered in the digital domain by the digital filter 122 to generate a filtered predistorted input, a digital signal. The output of the digital filter 122 may then be converted to an analog signal by the DAC 124. The analog signal generated by the DAC 124 may then be filtered by the analog filter 126. The output of the analog filter 126 may then be upconverted to RF by the mixer 128, which may receive a signal from a local oscillator (LO) 162 to translate the filtered analog signal from the analog filter 126 from baseband to RF. Other methods of implementing the transmitter circuit 120 are also possible and within the scope of the present disclosure. For instance, in another implementation (not illustrated in the present drawings) the output of the digital filter 122 can be directly converted to an RF signal by the DAC 124 (e.g., in a direct RF architecture). In such an implementation, the RF signal provided by the DAC 124 can then be filtered by the analog filter 126. Since the DAC 124 would directly synthesize the RF signal in this implementation, the mixer 128 and the local oscillator 162 illustrated in FIG. 1A can be omitted from the transmitter circuit 120 in such embodiments.

As further shown in FIG. 1, in some embodiments, the receiver circuit 150 may include a digital filter 152, an analog-to-digital converter (ADC) 154, an analog filter 156, and a mixer 158. In such a receiver, the feedback signal 151 may be downconverted to the baseband by the mixer 158, which may receive a signal from a local oscillator (LO) 160 (which may be the same or different from the local oscillator 160) to translate the feedback signal 151 from the RF to the baseband. The output of the mixer 158 may then be filtered by the analog filter 156. The output of the analog filter 156 may then be converted to a digital signal by the ADC 154. The digital signal generated by the ADC 154 may then be filtered in the digital domain by the digital filter 152 to generate a filtered downconverted feedback signal 151 $y'$, which may be a sequence of digital values indicative of the output y of the PA 130, and which may also be modelled as a vector. The feedback signal 151 $y'$ may be provided to the DPD circuit 110. Other methods of implementing the receiver circuit 150 are also possible and within the scope of the present disclosure. For instance, in another implementation (not illustrated in the present drawings) the RF feedback signal 151 $y'$ can be directly converted to a baseband signal by the ADC 154 (e.g., in a direct RF architecture). In such an implementation, the downconverted signal provided by the ADC 154 can then be filtered by the digital filter 152. Since the ADC 154 would directly synthesize the baseband signal in this implementation, the mixer 158 and the local oscillator 160 illustrated in FIG. 1A can be omitted from the receiver circuit 150 in such embodiments.

Further variations are possible to the RF transceiver 100 described above. For example, while upconversion and downconversion is described with respect to the baseband frequency, in other embodiments of the RF transceiver 100, an intermediate frequency (IF) may be used instead. IF may be used in superheterodyne radio receivers, in which a received RF signal is shifted to an IF, before the final detection of the information in the received signal is done. Conversion to an IF may be useful for several reasons. For example, when several stages of filters are used, they can all be set to a fixed frequency, which makes them easier to build and to tune. In some embodiments, the mixers of RF transmitter 120 or the receiver 150 may include several such stages of IF conversion. In another example, although a single path mixer is shown in each of the transmit (TX) path (i.e., the signal path for the signal to be processed by the transmitter 120) and the receive (RX) path (i.e., the signal path for the signal to be processed by the receiver 150) of the RF transceiver 100, in some embodiments, the TX path mixer 128 and the RX path mixer 158 may be implemented as a quadrature upconverter and downconverter, respectively, in which case each of them would include a first mixer and a second mixer. For example, for the RX path mixer 158, the first RX path mixer may be configured for performing downconversion to generate an in-phase (I) downconverted RX signal by mixing the feedback signal 151 and an in-phase component of the local oscillator signal provided by the local oscillator 160. The second RX path mixer may be configured for performing downconversion to generate a quadrature (Q) downconverted RX signal by mixing the feedback signal 151 and a quadrature component of the local oscillator signal provided by the local oscillator 160 (the quadrature component is a component that is offset from the in-phase component of the local oscillator signal by 90 degrees). The output of the first RX path mixer may be provided to a I-signal path, and the output of the second RX path mixer may be provided to a Q-signal path, which may be substantially 90 degrees out of phase with the I-signal path. In general, the transmitter circuit 120 and the receiver circuit 150 may utilize a zero-IF architecture, a direct conversion RF architecture, a complex-IF architecture, a high (real) IF architecture, or any suitable RF transmitter and/or receiver architecture.

In general, the RF transceiver 100 may be any device/apparatus or system configured to support transmission and reception of signals in the form of electromagnetic waves in the RF range of approximately 3 kHz to 300 GHz. In some embodiments, the RF transceiver 100 may be used for wireless communications, e.g., in a base station (BS) or a user equipment (UE) device of any suitable cellular wireless communications technology, such as Global System for Mobile Communication (GSM), Code Division Multiple Access (CDMA), or LTE. In a further example, the RF transceiver 100 may be used as, or in, e.g., a BS or a UE device of a millimeter-wave wireless technology such as 5G wireless (i.e., high frequency/short wavelength spectrum, e.g., with frequencies in the range between about 20 and 60 GHz, corresponding to wavelengths in the range between about 5 and 15 millimeters). In yet another example, the RF transceiver 100 may be used for wireless communications using Wi-Fi technology (e.g., a frequency band of 2.4 GHz, corresponding to a wavelength of about 12 cm, or a frequency band of 5.8 GHz, spectrum, corresponding to a wavelength of about 5 cm), e.g., in a Wi-Fi-enabled device such as a desktop, a laptop, a video game console, a smart phone, a tablet, a smart TV, a digital audio player, a car, a printer, etc. In some implementations, a Wi-Fi-enabled device may, e.g., be a node in a smart system configured to communicate data with other nodes, e.g., a smart sensor. Still in another example, the RF transceiver 100 may be used for wireless communications using Bluetooth technology (e.g., a frequency band from about 2.4 to about 2.485 GHz, corresponding to a wavelength of about 12 cm). In other embodiments, the RF transceiver 100 may be used for transmitting and/or receiving wireless RF signals for purposes other than communication, e.g., in an automotive radar system, or in medical applications such as magneto-resonance imaging (MRI). In still other embodiments, the RF transceiver 100 may be used for cable communications, e.g. in cable television networks.

Figure 2:
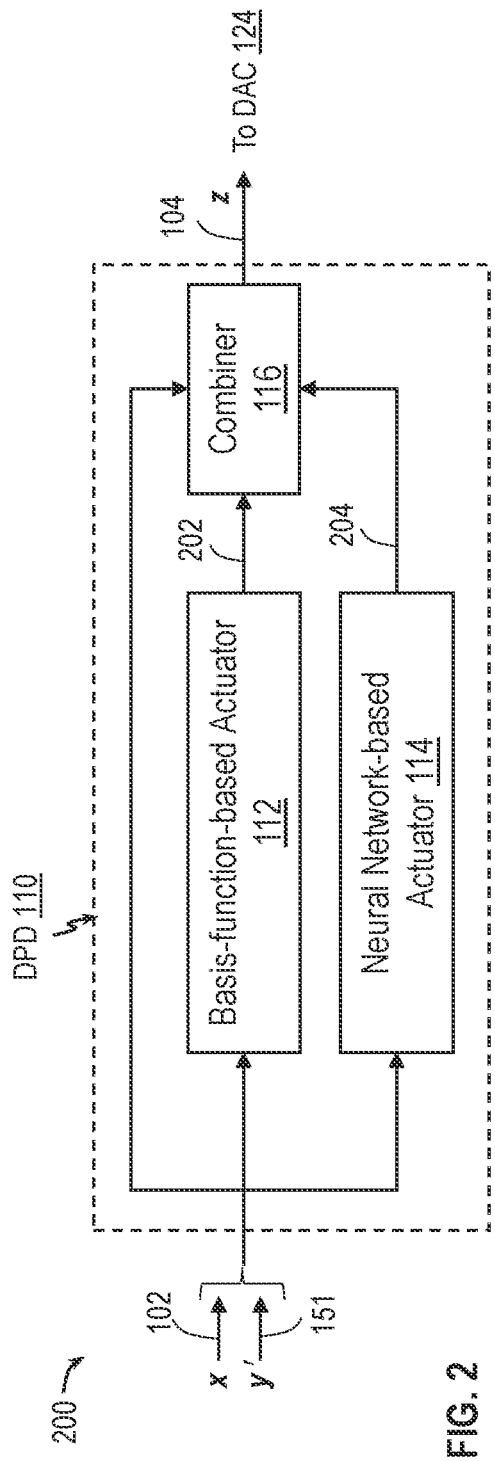
FIG. 2 provides a schematic illustration of an exemplary arrangement for a hybrid basis function, neural network-based DPD block, according to some embodiments of the present disclosure.
Figure 3:
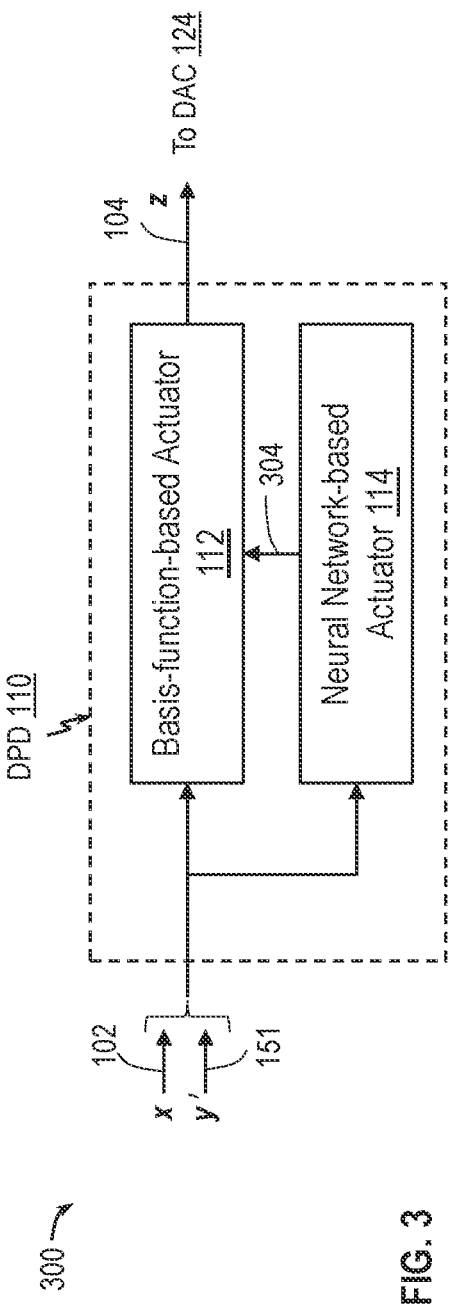
FIG. 3 provides a schematic illustration of an exemplary arrangement for a hybrid basis function, neural network-based DPD block, according to some embodiments of the present disclosure.
Figure 4:
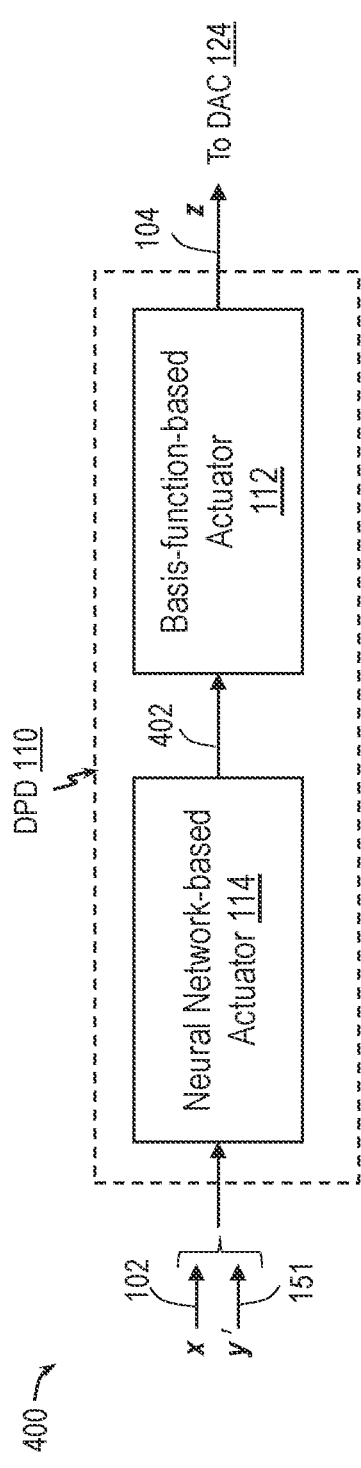
FIG. 4 provides a schematic illustration of an exemplary arrangement for a hybrid basis function, neural network-based DPD, according to some embodiments of the present disclosure.
Figure 5:
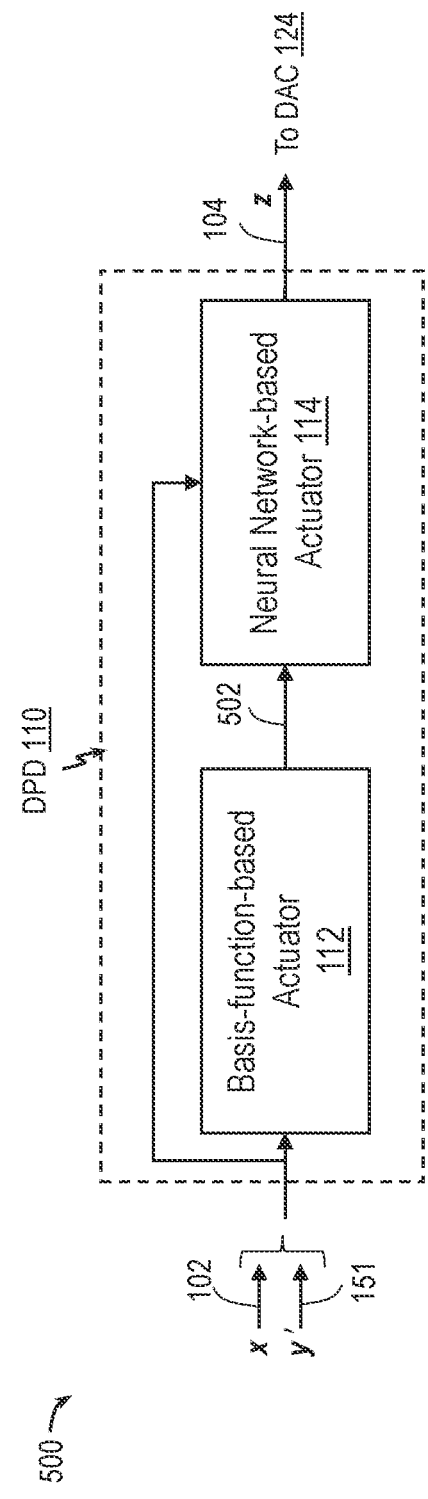
FIG. 5 provides a schematic illustration of an exemplary arrangement for a hybrid basis function, neural network-based DPD, according to some embodiments of the present disclosure.

Example Parallel and Cascaded Arrangements of Basis-Function-Based Actuator and Neural Network-Based Actuator As mentioned above, the basis-function-based actuator 112 and the neural network-based actuator 114 can be arranged in a parallel configuration or in a cascaded configuration, and may interact with each other in a variety of ways to generate a predistorted signal 104 $z$ from an input signal 102 $x$. At a high level, inputs to the basis-function-based actuator 112 can be any subset or transformed version of the input signal 102 x, the feedback signal 151 y' or an output of the neural network-based actuator 114. Similarly, inputs to the neural network-based actuator 114 can be any subset or transformed version of the input signal 102 x, the feedback signal 151 y' or an output of the basis-function-based actuator 112. The predistorted signal 104 z can be taken from the output of the basis-function-based actuator 112, the output of the neural network-based actuator 114, or a combined waveform of the input signal x, the basis-function-based actuator 112's output, and/or the neural network-based actuator 114's output. FIGS. 2 and 3 are discussed in relation to FIG. 1 in which the basis-function-based actuator 112 and the neural network-based actuator 114 are arranged in a parallel configuration. FIGS. 4 and 5 are discussed in relation to FIG. 1 in which the basis-function-based actuator 112 and the neural network-based actuator 114 are arranged in a cascaded configuration. For simplicity, FIGS. 2-5 may use the same reference numerals as in FIG. 1 to refer to the same elements or the same signals.

FIG. 2 provides a schematic illustration of an exemplary arrangement 200 for a hybrid basis function, neural network-based DPD, according to some embodiments of the present disclosure. For example, the basis-function-based actuator 112 and the neural network-based actuator 114 of the DPD circuit 110 of FIG. 1 can be arranged in a parallel configuration as shown in the arrangement 200.

As shown in FIG. 2, each of the basis-function-based actuator 112 and the neural network-based actuator 114 may take at least one of the input signal 102 x or the feedback signal 151 y' (indicative of the output signal 131 y output of by the PA 130) as an input. For example, the basis-function-based actuator 112 may perform a first DPD operation by processing at least one of the input signal 102 x or the feedback signal 151 y' using a set of basis functions (e.g., Volterra series, GMPs, DDR functions, piecewise linear functions, etc.) to generate an output signal 202. The neural network-based actuator 114 may perform a second DPD operation by processing at least one of the input signal 102 x or the feedback signal 151 y' using one or more neural networks (e.g., convolutional neural networks, recurrent neural networks, etc.) to generate an output signal 204.

More specifically, in one example, as part of the first operation, the basis-function-based actuator 112 may process the input signal 102 x using a set of basis functions to generate the output signal 202. In another example, as part of the first operation, the basis-function-based actuator 112 may process the input signal 102 x and the feedback signal 151 y' using a set of basis functions to generate the output signal 202. Similarly, in one example, as part of the second DPD operation, the neural network-based actuator 114 may process the input signal 102 x using one or more neural networks to generate the output signal 204. In another example, as part of the second DPD operation, the neural network-based actuator 114 may process the input signal 102 x and the feedback signal 151 y' one or more neural networks to generate the output signal 204. That is, the one or more neural networks may be trained to update and adapt its parameters to generate at least a portion or a component of the predistorted signal 104 z.

Further, in some aspects, the basis-function-based actuator 112 may preprocess its input (e.g., the input signal 102 x and/or the feedback signal 151 y') before applying the set of basis functions to the input. Similarly, the neural network-based actuator 114 may preprocess its input (e.g., the input signal 102 x and/or the feedback signal 151 y') before applying the one or more neural networks to the input. Some examples of preprocessing may include envelope magnitude computation, downsampling, etc. In certain aspects, the basis-function-based actuator 112 may be a LUT-based actuator in which the set of basis functions and associated linear combination coefficients (e.g., c) are stored as LUT(s). The basis-function-based actuator 112 may compute magnitude(s) of the input signal 102 x (e.g., a complex based band in-phase/quadrature-phase (I/Q) signal) and generate the output signal 202 based on a table lookup from the LUT(s) using the computed magnitude(s). The neural network-based actuator 114 may pass the input signal 102 x and/or the feedback signal 151 y' through the network layers of at least a first neural network of the one or more neural networks.

As further shown in FIG. 2, the combiner 116 may combine the input signal 102 x, the output signal 202 of the basis-function-based actuator 112, and/or the output signal 204 of the neural network-based actuator 114 to generate the predistorted signal 104 z. Subsequently, the predistorted signal 104 z may be sent to the DAC 124 for transmission. The combiner 116 may have various structures as will be discussed more fully below with reference to FIGS. 8-10. In some instances, the input signal 102 x, the predistorted signal 104 z, the feedback signal 151 y', the output signal 202 of the basis-function-based actuator 112, and output signal 204 of the neural network-based actuator 114 are digital baseband I/Q signals (including complex I/Q samples).

The arrangement 200 can advantageously allow the basis-function-based actuator 112 and the neural network-based actuator 114 to operate independently, for example, optimized and/or adapted separately. In this regard, the set of basis functions used by the basis-function-based actuator 112 may be configured to linearize a first nonlinear characteristic of the PA 130, and the one or more neural networks used by the neural network-based actuator 114 may be configured to linearize a second nonlinear characteristic. The first and second nonlinear characteristics can be different (e.g., different order of nonlinearities or different combinations of orders of nonlinearities). Alternatively, the first and second nonlinear characteristics can be the same, where the one or more neural networks at the neural network-based actuator 114 may be trained to adapt to dynamic conditions that may cause the nonlinearities of the PA 130 to vary.

FIG. 3 provides a schematic illustration of an exemplary arrangement 300 for a hybrid basis function, neural network-based DPD, according to some embodiments of the present disclosure. For example, the basis-function-based actuator 112 and the neural network-based actuator 114 of the DPD circuit 110 of FIG. 1 can be arranged in a parallel configuration as shown in the arrangement 300. The arrangement 300 of FIG. 3 may be substantially similar to the arrangement 200 of FIG. 2. For example, the basis-function-based actuator 112 in the arrangement 300 may operate in a substantially similar way as the basis-function-based actuator 112 in the arrangement 200 discussed above. However, the predistorted signal 104 z corresponds to the output of the basis-function-based actuator 112 instead of a combined output of the basis-function-based actuator 112 and the neural network-based actuator 114 as in FIG. 2.

As shown in FIG. 3, the output signal 304 of the neural network-based actuator 114 is provided to the basis-function-based actuator 112. More specifically, the neural network-based actuator 114 may perform a DPD operation by processing at least one of the input signal 102 x or the feedback signal 151 y' using one or more neural networks (e.g., convolutional neural networks, recurrent neural networks, etc.) to generate the output signal 304. The output signal 304 may be used to update parameter(s) of the basis-function-based actuator 112. Accordingly, the one or more neural networks may be trained to generate DPD features (e.g., nonlinear characteristics) of the PA 130 and update parameters of the basis-function-based actuator 112 for predistorting the input signal. In a certain example, the output signal 304 may be used to update DPD coefficients (or program the LUTs) used by the basis-function-based actuator 112 to generate the predistorted signal 104 $z$.

Further, in some aspects, the basis-function-based actuator 112 may preprocess its input (e.g., the input signal 102 $x$ and/or the feedback signal 151 $y'$) before applying the set of basis functions and/or the neural network-based actuator 114 may preprocess its input (e.g., the input signal 102 $x$ and/or the feedback signal 151 $y'$) before applying the one or more neural networks as discussed above with reference to FIG. 2.

The arrangement 300 can advantageously use the neural network-based actuator 114 to assist the basis-function-based actuator 112, for example, to adapt to dynamic conditions that the basis-function-based actuator 112 may otherwise be unable to achieve by itself. In some examples, the neural network-based actuator 114 can adapt to dynamic changes at the PA 130 and can be used in place of a DPD adaptation circuit to update (DPD coefficients and/or LUTs of) the basis-function-based actuator 112.

In general, the parallel DPD arrangement 200 and/or 300 discussed above can operate at different sampling rates. For example, the basis-function-based actuator 112 may operate in a full signal sampling rate while the neural network-based actuator 114 may operate at a lower rate (a downsampled rate) as discussed below with reference to FIGS. 6 and 7. In some instances, the neural network-based actuator 114 may also include multiple neural networks that operate at different sampling rates as will be discussed more fully below with reference to FIG. 7. In this way, the neural network-based actuator 114 may account for dynamic changes and/or long-term memory effects that may not be tracked or modelled by the set of basis functions used by the basis-function-based actuator 112.

FIG. 4 provides a schematic illustration of an exemplary arrangement 400 for a hybrid basis function, neural network-based DPD, according to some embodiments of the present disclosure. For example, the basis-function-based actuator 112 and the neural network-based actuator 114 of the DPD circuit 110 of FIG. 1 can be arranged in a cascaded configuration as shown in the arrangement 400.

As shown in FIG. 4, the basis-function-based actuator 112 is coupled to the output of the neural network-based actuator 114. For example, the neural network-based actuator 114 may perform a DPD operation by processing at least one of the input signal 102 $x$ or the feedback signal 151 $y'$ using one or more neural networks (e.g., convolutional neural networks, recurrent neural networks, etc.) to generate an output signal 402. The basis-function-based actuator 112 may perform another DPD operation by processing the output signal 402 of the neural network-based actuator 114 using a set of basis functions (e.g., Volterra series, GMPs, DDR functions, piecewise linear functions, etc.) to generate a predistorted signal 104 $z$. That is, the one or more neural networks may be trained and adapted to preprocess the at least one of the input signal 102 $x$ or the feedback signal 151 $y'$ (e.g., to generate features) prior to processing by the basis-function-based actuator 112.

Further, in some aspects, the neural network-based actuator 114 may preprocess its input (e.g., the input signal 102 $x$ and/or the feedback signal 151 $y'$) before applying the one or more neural networks. Additionally or alternatively, the basis-function-based actuator 112 may preprocess its input (e.g., the output signal 402 of the neural network-based actuator 114) before applying the set of basis functions.

The arrangement 400 may advantageously use the neural network-based actuator 114 to assist the basis-function-based actuator 112 in generating features from the input signal 102 $x$ and/or the feedback signal 151 $y'$. In some examples, the output signal 402 of the neural network-based actuator 114 may include information associated with properties of the PA 130 or the transformation on the input signal 102 $x$ that cannot be easily captured or represented by the basis-function-based actuator 112.

FIG. 5 provides a schematic illustration of an exemplary arrangement 500 for a hybrid basis function, neural network-based DPD, according to some embodiments of the present disclosure. For example, the basis-function-based actuator 112 and the neural network-based actuator 114 of the DPD circuit 110 of FIG. 1 can be arranged in a cascaded configuration as shown in the arrangement 500. The arrangement 500 of FIG. 5 may be substantially similar to the arrangement 400 of FIG. 4, but the order of the basis-function-based actuator 112 and the neural network-based actuator 114 in the signal path is swapped. As shown in FIG. 5, the neural network-based actuator 114 is coupled to the output of the basis-function-based actuator 112.

For example, the basis-function-based actuator 112 may perform a DPD operation by processing at least one of the input signal 102 $x$ or the feedback signal 151 $y'$ using a set of basis functions (e.g., Volterra series, GMPs, DDR functions, piecewise linear functions, etc.) to generate an output signal 502. Subsequently, the neural network-based actuator 114 may perform another DPD operation by processing the output signal 502 of the basis-function-based actuator 112 to generate a predistorted signal 104 $z$. Further, in some aspects, the neural network-based actuator 114 may also process the input signal 102 $x$ or the feedback signal 151 $y'$ using the one or more neural networks. As such, the one or more neural networks (used by the neural network-based actuator 114) may be trained and adapted to post-process an output signal of the basis-function-based actuator 112 and/or process the input signal 102 $x$ or the feedback signal 151 $y'$.

Further, in some aspects, the basis-function-based actuator 112 may preprocess its input (e.g., the input signal 102 $x$ and/or the feedback signal 151 $y'$) before applying the one or more neural networks to the input. Additionally or alternatively, the neural network-based actuator 114 may preprocess its input (e.g., the output signal 502 of the basis-function-based actuator 112) before applying the set of basis functions to the input.

The arrangement 500 may advantageously use the neural network-based actuator 114 to account for features (e.g., dynamic changes and/or nonlinearity effects) that are not modelled by the basis-function-based actuator 112. For instance, the basis-function-based actuator 112 may have a limited memory, and thus may not be able to correct or linearize certain long-term memory effects of the PA 130. Accordingly, the neural network-based actuator 114 may be trained to modify the basis-function-based actuator 112's output to correct for long-term variations. Additionally or alternatively, the basis-function-based actuator 112 may perform less complex DPD operations while the neural network-based actuator 114 may perform more complex DPD operations. For example, because the basis functions may be based on analytical equations, and thus may have limitations (e.g., can model certain nonlinearities, but not other more complex or higher-order nonlinearities). Accordingly, the neural network-based actuator 114 may be used to model arbitrary nonlinear functions (e.g., with a higher degree of freedom), which may or may not be representable by analytical mathematical equations.

As can be seen from the above discussions, the various DPD arrangements 200, 300, 400, and 500 have different benefits. Accordingly, the DPD circuit 110 may be configured using the DPD arrangement 200, 300, 400, or 500 depending on the availabilities of hardware resources (e.g., memory), nonlinear characteristics (e.g., trapped charges, memory effects, etc.) of the PA 130 under linearization, and/or a target linearization performance metric. Further, in some aspects, the neural network-based actuator 114 in the DPD arrangements 200, 300, 400, and/or 500 can include a neural net processor or accelerator (e.g., the accelerator 670 of FIG. 6 and/or the accelerator 760 of FIG. 7). The neural net processor or accelerator may have an architecture and/or hardware operations that allow for an efficient computation of neural network-specific processing (e.g., the layer processing with multiply-add operations for combining weighted outputs from a previous layer in a convolutional layer, ReLU operations, biasing operations, etc.).

Example DPD Arrangements with Neural Network Model(s)

One aspect of the present disclosure provides DPD arrangements with amplifier state estimation branches that are based on a neural network model and are configured to estimate, predict, and compensate for slow effects such as signal dynamics or GaN charge trapping.

Neural networks have been shown to have the capability to approximate arbitrary nonlinear functions with good precision over a wide range of applications. A neural network model can be configured to take both transmission (e.g., the input signal 102 $x$) and loop-back observation (e.g., the feedback signal 151 $y'$) of a PA's output (e.g., the PA 130's output) and generate useful feature vectors (PA state estimation). Such neural networks can also be trained with a wide variety of waveforms with different dynamic behaviors, e.g., behaviors that cause GaN PA charge trapping or junction temperature changes. In addition, in some embodiments, a state dynamics model may be configured to take the previous state estimation and the next input signal and predict the next state (PA state prediction), assuming the PA state change is mainly caused by the input excitation. Therefore, the prediction of future states may no longer need the observation channel. To address much longer timespan of signal/system dynamics, in some embodiments, this model may be trained with downsampled waveforms, which may include predominantly (e.g., only) the long-term evolution of the system. In conjunction with the predistortion model running at the sampling rate (which may be either a neural network model or a GMP model in various embodiments), the combination of the two can perform predistortion with a dynamic system through a combiner model, i.e., a model similar to the combiner 116 of FIG. 2 that takes the output of both models and output I/Q samples to a DAC (e.g., the DAC 124). Since the PA state estimation network is running at a low sample rate, an accelerator (e.g., the accelerator 670 of FIG. 6 and/or the accelerator 760 of FIG. 7) can be built to handle the actuation of the model.

Modelling long-term effect in PA ranging from microseconds to milliseconds purely based on transmission signal typically requires a long capture buffer (e.g., tens of thousands of samples) and a very deep memory model. DPD arrangements with amplifier state estimation branches, proposed herein, are configured to first estimate the current PA state by comparing short captures of both transmission and observation signal during actuation (as opposed to adaptation in conventional implementations). Such DPD arrangements may be further configured to track and predict future PA states using the current PA state and future transmission signal without observation. In some embodiments, such DPD arrangements may be configured to utilize estimated PA state to generate sample-wise correction signal to compensate the main DPD actuation.

Figure 6:
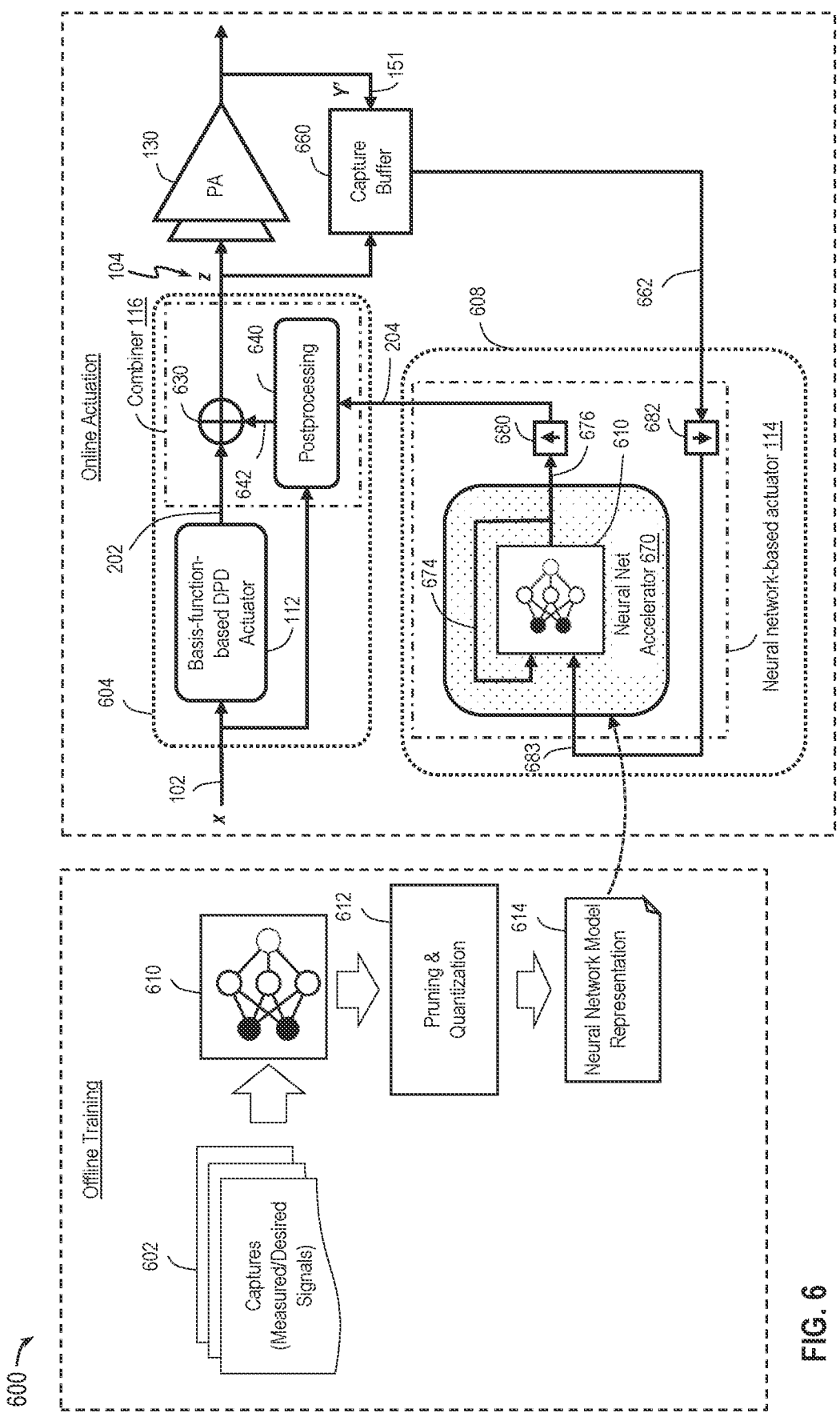
FIG. 6 provides an illustration of a scheme for offline training and online actuation for a hybrid basis function, neural network-based DPD, according to some embodiments of the present disclosure.

FIGS. 6-12 illustrate various aspects of DPD arrangements with neural network model(s). FIG. 6 provides an illustration of a scheme 600 for offline training and online actuation for a hybrid basis function, neural network-based DPD, according to some embodiments of the present disclosure. The scheme 600 includes an offline training shown on the left side of FIG. 6 and an online actuation on the right side of FIG. 6. In order not to clutter the drawings, FIG. 6 only shows elements that are salient to DPD actuations, but the online actuation can include a transmitter circuit (e.g., similar to the transmitter circuit 120 including at least the DAC 124) between the output of the combiner 116 and the input of the PA 130, and a receiver circuit (e.g., similar to the receiver circuitry 150 including the ADC 154) between the output of the PA 130 and the capture buffer 660. In some aspects, the DPD circuit 110 of FIG. 1 and/or the arrangement 200 of FIG. 2 may be trained and deployed using the scheme 600. For simplicity, FIG. 6 may use the same reference numerals as FIGS. 1 and 2 to refer to the same elements or the same signals.

As shown by the online actuation on the right side of FIG. 6, the basis-function-based actuator 112 and the neural network-based actuator 114 of the DPD circuit 110 of FIG. 1 are arranged in a substantially similar way as the arrangement 200 of FIG. 2. For instance, online actuation may include the basis-function-based actuator 112 processing the input signal 102 $x$ using a set of basis functions and a set of associated DPD coefficients to generate an output signal 202. The online actuation may further include the neural network-based actuator 114 to process captured signals 662 to generate an output signal 204. The combiner 116 may combine the output signal 202 of the basis-function-based actuator 112 and the output signal 204 of the neural network-based actuator 114 to generate a predistorted signal 104 $z$. In general, the combiner 116 may combine the output signal 202 from the basis-function-based actuator 112, the output signal 204 from the neural network-based actuator 114, and/or the input signal 102 $x$ to generate the predistorted signal 104 $z$.

The combiner 116 may have various structures. FIG. 6 illustrate one example structure for the combiner 116. In the illustrated example, the combiner 116 may include a post-processing circuit 640 to post-process the output signal 204 and the input signal 102 $x$ to output a postprocessed signal 642. The combiner 116 may further include a signal summing circuit 630 to add the postprocessed signal 642 to the output signal 202 (from the basis-function-based actuator 112) to generate the predistorted signal 104 $z$. Further, delays can be added to any of the output signal 202 from the basis-function-based actuator 112, the output signal 204 from the neural network-based actuator 114, and/or the input signal 102 $x$ for time-alignment prior to the combining as will be discussed more fully below with reference to FIG. 7. Various example structures for the combiner 116 will be discussed more fully below with reference to FIGS. 8-10. As similarly discussed above with reference to FIG. 1, the predistorted signal 104 $z$ may be sent to the PA 130 for transmission. Further, the online actuation may include a capture memory or buffer 660 (e.g., implemented as part of the DPD circuit 110). The capture buffer 660 may perform a plurality of captures of the predistorted signal 104 z (or transmission signal) and the feedback signal 151 y' (or observation signal) indicative of an output of the PA 130. For example, each capture may include a certain number of digital I/Q samples. In some examples, the captures can be performed according to a certain duty cycle, for example, depending on the available memory for storing the captures and/or the memory effects of the PA 130. For example, a short segment (e.g., N samples) of the predistorted signal 104 z and/or a short segment of the feedback signal 151 y' can be captured at certain time intervals.

In the illustrated example of FIG. 6, the neural network-based actuator 114 may include a neural net accelerator 670. The neural net accelerator 670 may perform processing for a neural network model 610, for example, trained specifically for performing DPD operations (e.g., including PA state prediction, PA state estimation, and/or nonlinear pre-compensation) along with the basis-function-based actuator 112. In some aspects, the neural net accelerator 670 may have an architecture and/or hardware operations that allow for an efficient computation of neural network-specific processing (e.g., the layer processing units with multiply-add operations for combining weighted outputs from a previous layer in a convolutional layer, ReLU operations, biasing operations, etc.). As further shown in FIG. 6, the neural network-based actuator 114 may include a downsampling circuit 682 to downsample the captured signals 662 to provide downsampled signal(s) 683. The neural net accelerator 670 may process the downsampled signal(s) 683 according to the trained neural network model 610 to provide an output signal 676. In some aspects, the neural net accelerator 670 may optionally track the internal states (e.g., shown as 674) of the neural network model 610 and may process the downsampled signal(s) 683 and the internal states 674 to generate the output signal 676, for example, when the neural network model 610 is a recurrent neural network model. The neural network-based actuator 114 may further include an upsampling circuit 680 to upsample the output signal 676 of the neural network model 610 to generate the signal 204. That is, the operations within 604 (including the basis-function-based actuator 112 and the combiner 116) may be performed at a full sampling rate (e.g., at the sampling rate of the incoming signal 102 x) while the operations within 608 (including the neural network-based actuator 114) may be performed at a lower sampling rate. As an example, the downsampling circuit 682 may downsample its input by a factor of K, and the upsampling circuit 680 may upsample its input signal by the same factor of K, where K can be 2, 3, 4, or any suitable value. While FIG. 6 illustrates the neural network-based actuator 114 operating at a downsampled rate, in other aspects, the neural network-based actuator 114 can operate at the same full signal sampling rate as the basis-function-based actuator 112.

In an aspect, the PA 130 compensated by the combiner 116 using the outputs (e.g., the signal 204) of the PA state estimation and tracking implemented by the neural net accelerator 670 may manifest short-term memory effects. These short-term memory effects can be handled (corrected) by the basis-function-based actuator 112. In some embodiments, the basis-function-based actuator 112, the neural network-based actuator 114 and the combiner 116 may be included within a DPD actuator circuit (e.g., the DPD circuit 110). In some instances, the basis-function-based actuator 112 may be referred to as a main DPD or sample rate actuator, and the neural network model 610 may be referred to as a PA state estimation model.

As shown by the left side of FIG. 6, pre-training may include the following processes. First, data may be captured from the transmission path and the observation path (of a target hardware, for example, as shown in the right side of FIG. 6) with a variety of input stimulus to the PA 130 to form a training dataset (shown as captures 602). The captures 602 may include captures of the predistorted signal 104 z and/or the feedback signal 151 y'. Next, an optimization algorithm may be used to train the neural network model 610 to estimate the PA state based on the captured data 602. Finally, a combiner model (that models the combiner 116) may be trained alongside with the PA state estimation model to generate correction signals (e.g., the predistorted signal 104 z). In some embodiments, the PA state estimation model may be trained alongside with both a main DPD model (that models the basis-function-based actuator 112) and the combiner model to estimate the PA state based on the captured data 602. In other embodiments, a main DPD model may be first pretrained based on the captured data 602, and after that the PA state estimation model may be trained alongside with the pretrained main DPD model and the combiner to estimate the PA state based on the captured data 602. Stated differently, the neural network model 610 may be trained using the captures 602, for example, by passing captures of the predistorted signal 104 z and/or the feedback signal 151 y' through the layers of the neural network model 610 and using a backpropagation to update the weights (or parameters) of the neural network model 610 until an output of the neural network model 610 is optimized (i.e., when an error between the output predicted by the neural network model 610 and the desired signal is minimized or satisfies certain criteria). In some examples, after the PA state estimation model or the neural network model 610 is trained, further pruning and quantization 612 and/or any other postprocessing may be performed to generate a neural network model representation 614. In some examples, the neural network model representation 614 may include the trained weight parameters. The neural network model representation 614 may be used by the neural network-based actuator 114 for online actuation. For instance, the neural network model representation 614 (the trained parameters) may be stored at a memory and the neural net accelerator 670 may perform neural network processing using the stored parameters.

As further shown by the right side of FIG. 6, post-deployment operation may include the following processes. First, short segment of the transmission signal (e.g., the predistorted signal 104 z) from the output of the main DPD (e.g., the basis-function-based actuator 112) may be captured. Optionally, short segment of the observation signal (e.g., the feedback signal 151 y') from the output of the PA 130 may be captured. Next, the pretrained PA state estimation model (e.g., the model 610) may estimate the PA state using the captured signal 662. In some embodiments, the pretrained PA state estimation model may directly estimate the PA state by comparing the captured transmission signal (e.g., captures of the predistorted signal 104) and capture observation signal (e.g., captures of the feedback signal 151), if observation is available. In contrast to prior art DPD implementations where observation is only used for adaptation (i.e., an optimization algorithm that uses the observation to find the next set of coefficients in the actuator), which has a delay on the order of seconds from the time of capture to effects in actuation, in the PA state estimation and compensation DPD arrangement shown in the right side of FIG. 6 (which is similar to the arrangement 200 of FIG. 2), observation is directly fed into actuator (e.g., the basis-function-based actuator 112) for compensation, with a delay on the order of microseconds from the time of capture to actuation. In some embodiments, the pretrained PA state estimation model may estimate the PA state using the previous PA state and the captured transmission signal (if observation is not available). This is in contrast to prior art DPD implementations that use a feedforward model that does not have the capability to self-correct model drift from observation as needed and have no explicit observation receiver duty-cycling mechanism for optimal performance. In the next process, the combiner 116 may combine the output (e.g., the signal 202) of the main DPD and the estimated PA state vector (e.g., the signal 204) to generate the final predistortion signal, which is then fed to the PA 130. After that, the main DPD may perform its own adaptation without the knowledge of the PA state estimation model and the combiner model. Finally, the PA state estimation model may perform adaptation, where parameter updates may be performed using any suitable known optimization algorithm (such as Stochastic Gradient Descent).

Figure 11:
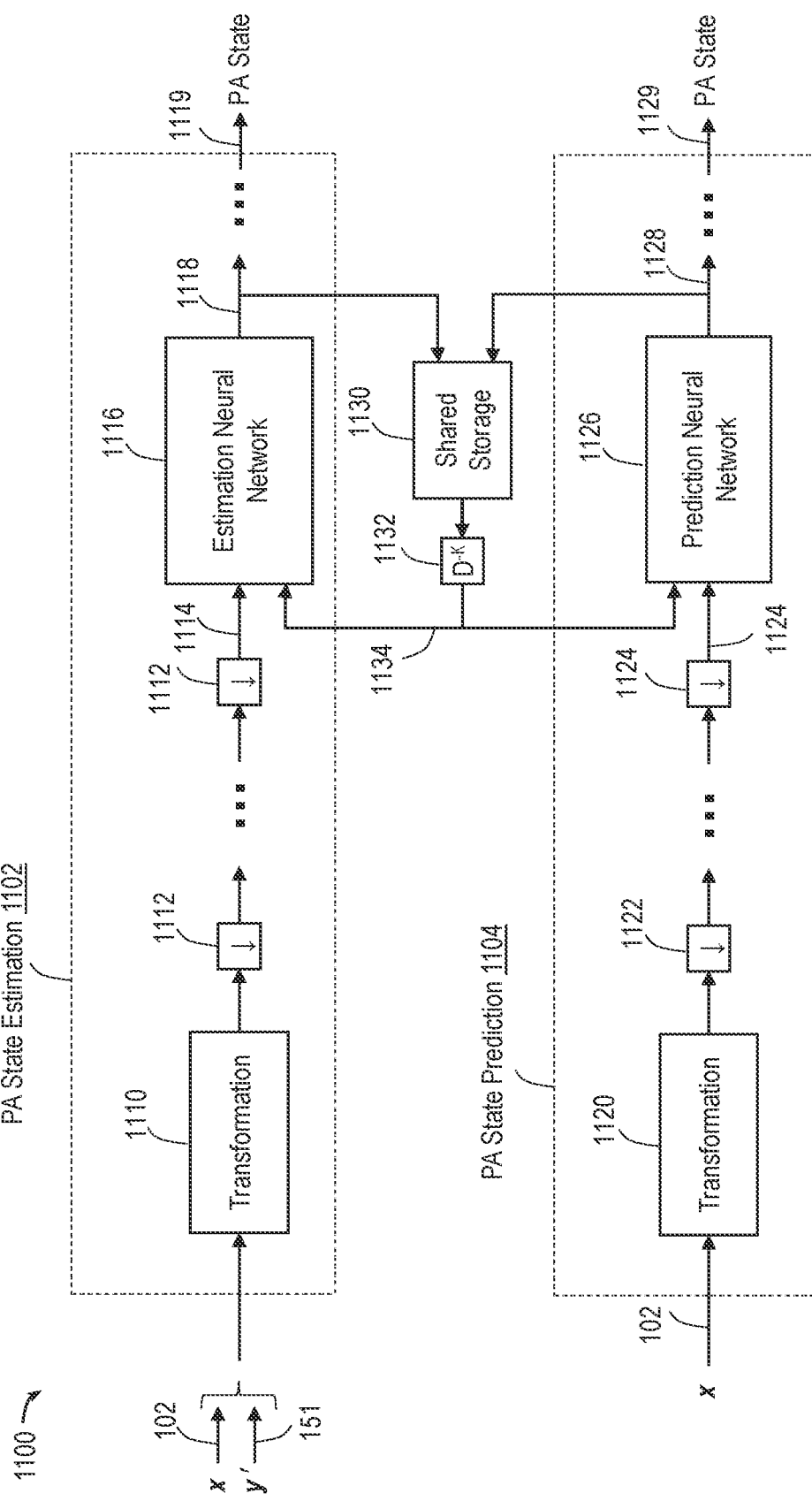
FIG. 11 provides a schematic illustration of an exemplary PA state estimation and prediction implementation in a hybrid basis function, neural network-based DPD, according to some embodiments of the present disclosure.

With respect to sample decimation, in some embodiments, the PA state estimation model, included in the neural net accelerator 670, may operate at a decimated sample rate to capture memory effects over a long-time horizon, e.g., on the order of microseconds. Optional deterministic transformation may be applied to the inputs prior to the first downsampling. In some embodiments, the PA state estimation model may include multiple downsampling stages as shown in FIGS. 7 and 11.

Figure 7:
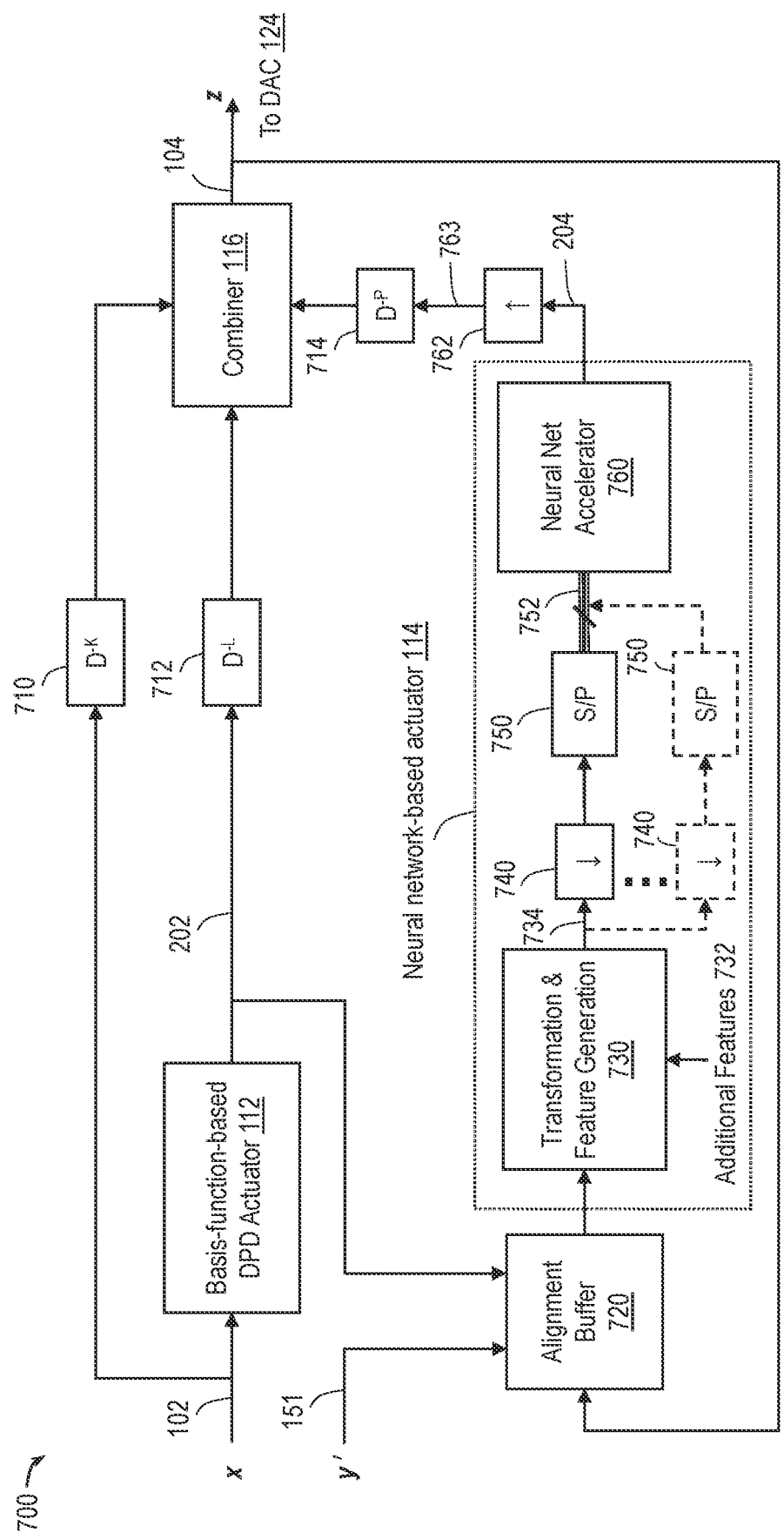
FIG. 7 provides a schematic illustration of an exemplary arrangement for a hybrid basis function, neural network-based DPD, according to some embodiments of the present disclosure.

FIG. 7 provides a schematic illustration of an exemplary arrangement 700 for a hybrid basis function, neural network-based DPD, according to some embodiments of the present disclosure. The arrangement 700 may be substantially similar to the arrangement 200 of FIG. 2 and/or the DPD hardware used for the online actuation in the scheme 600 of FIG. 6 and may provide a more detailed view of the internal elements of the neural network-based actuator 114 and interactions (or coordination) between the basis-function-based actuator 112, the combiner 116, and the neural network-based actuator 114. For simplicity, FIG. 7 may use the same reference numerals as in FIGS. 1, 2, and 6 to refer to the same elements or the same signals.

As shown in FIG. 7, the arrangement 700 may include a basis-function-based actuator 112, a neural network-based actuator 114, a combiner 116, an alignment buffer 720, delay circuits 710, 712, 714, and upsampling circuit 762. The basis-function-based actuator 112 may process the input signal 102 $x$ (e.g., digital baseband I/Q signal encoded with data for transmission) using a set of basis functions and associated DPD coefficients to generate an output signal 202. The alignment buffer 720 may be similar to the capture buffer 660. The alignment buffer 720 may include captures (e.g., N I/Q samples) of a feedback signal 151 $y'$ (an observed signal indicative of an output of a PA 130), captures (e.g., N I/Q samples) of the output signal 202 of the basis-function-based actuator 112, and/or captures (e.g., N I/Q samples) of a predistorted signal 104 $z$ (output of the combiner 116). The feedback signal 151 $y'$, predistorted signal 104 $z$, and the output signal 202 may be at a full signal sampling rate (e.g., Fs) and time-aligned and stored at the alignment buffer 720. For example, because of processing and/or signal propagation delays in the transmission path and the feedback path, a respective delay can be added to each of the output signal 202 and the predistorted signal 104 $z$, and the feedback signal 151 $y'$ so that there may be a one-to-one correspondence at a sample level among these signals stored at the buffer 720.

As further shown in FIG. 7, the neural network-based actuator 114 may include a transformation and feature generation block 730 (e.g., digital circuits and the processors executing instruction codes), one or more downsampling circuits 740 similar to the downsampling circuit 682, one or more serial-to-parallel (SIP) circuits 750, a neural net accelerator 760 similar to the neural net accelerator 670, and an upsampling circuit 762 similar to the upsampling circuit 680. The transformation and feature generation block 730 may take the time-aligned feedback signal 151 $y'$, predistorted signal 104 $z$, the output signal 202 and/or additional features 732 as inputs and generate a signal 734 (e.g., features related to nonlinear characteristics of the PA 130) based on the inputs. Some examples of the additional features 732 may include but not limited to, an analog gain setting (in the transmit path and/or receive path), a temperature (e.g., a current operating temperature), a symbol power of the feedback signal 151 $y'$, and/or any operating parameter and/or measurement that may cause the DPD to behave differently. The additional features 732 may be provided by other circuitries (e.g., detection and/or measurement circuitries) and/or read from CPU-accessible registers. As an example, the analog gain setting can be obtained directly from circuitries (e.g., detection and/or measurement circuitries). Alternatively, the analog gain setting can be controlled digitally via registers, and can be read back. As another example, the DPD apparatus or the RF transceiver that include the basis-function-based actuator 112 and the neural network-based actuator 114 can include temperature sensing circuitry and can provide an indication of a current operating temperature via a register read.

The signal 734 can be downsampled by the downsampling circuit(s) 740. The S/P circuit 750 may perform a serial-to-parallel conversion on a downsampled signal and provide the converted signal 752 to the neural net accelerator 760. For instance, the neural net accelerator 760 may utilize parallel processing to process the signal 752. As an example, a neural network model (e.g., the model 610) may operate on a block of downsampled samples at a time, and the S/P circuit 750 may provide the target sample blocks to the neural net accelerator 760. The neural network-based actuator 114 can optionally include multiple parallel downsampling paths as shown by the downsampling circuits 740 and associated S/P circuit 750 with the dashed lines. In some examples, the different downsampling paths perform at different downsampled rates. That is, the neural net accelerator 760 can run multiple neural network models at different rates, for example, for estimation or predictor of different PA state information. After processing the signal 752 through corresponding neural network(s), the neural net accelerator 760 may generate the output signal 204. The upsampling circuit 762 may upsample the output signal 204 to a signal 763 before providing the output of the neural network-based actuator 114 to the combiner 116. In some examples, when the neural network-based actuator 114 include multiple downsampling paths with different downsampling factors, the upsampling circuit 762 may upsample outputs from the neural net accelerator 760 according to corresponding downsampling factors so that the signal 763 may be back at the full signal sampling rate. In general, the upsampling can be performed as part of the neural network-based actuator 114 or part of the processing at the neural net accelerator 760 or external to the neural network-based actuator 114.

As further shown in FIG. 7, the input signal 102 x, the signal 202 generated by the basis-function-based actuator 112, and the signal 763 generated by the neural network-based actuator 114 can be delayed by the delay circuits 710, 712, and 714, respectively, before providing them to the combiner 116. As similarly discussed above, there can be processing and/or signal propagation delays from the different paths. Accordingly, the delay circuits 710, 712, and 714 can time-align the input signal 102 x, the signal 202, and the signal 763 before the combiner 116. For instance, the delay circuit 710 can delay the input signal 102 x by K samples, the delay circuit 712 can delay the signal 202 by L samples, and the delay circuit 714 can delay the signal 763 by P samples, where K, L, and P can have different values. The combiner 116 may combine the delayed input signal 102 x, the delayed output signal 202 of the basis-function-based actuator 112, and the delayed output signal 763 of the neural network-based actuator 114 to generate the predistorted signal 104 z. The combiner 116 may have a structure as shown in FIG. 6 or other structures as discussed below with reference to FIGS. 8-10.

Figure 8:
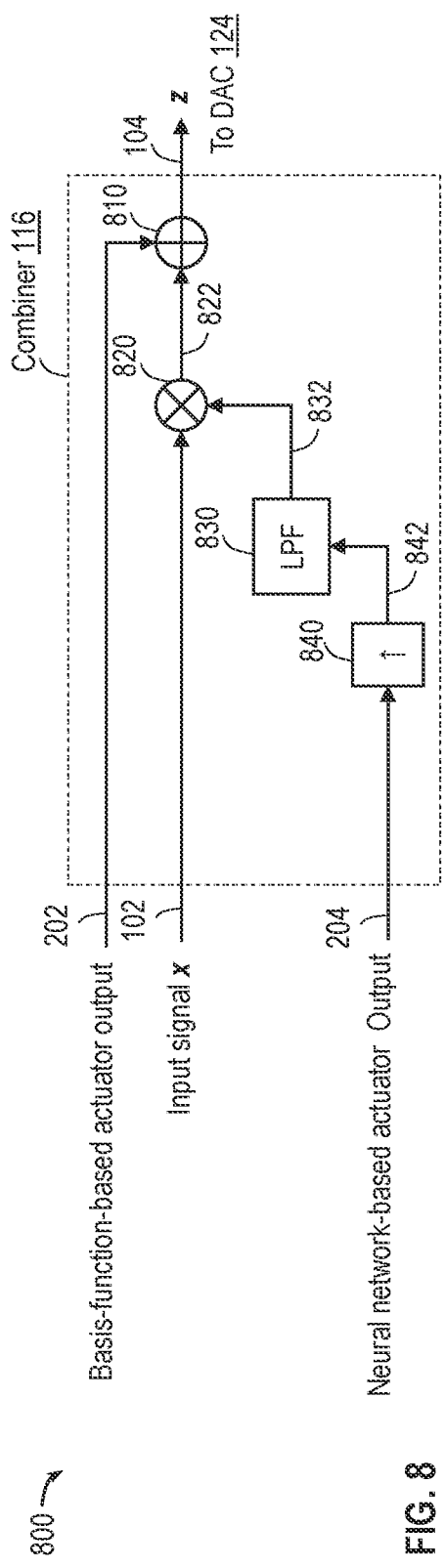
FIG. 8 provides a schematic illustration of an exemplary arrangement for a combiner in a hybrid basis function, neural network-based DPD, according to some embodiments of the present disclosure.
Figure 9:
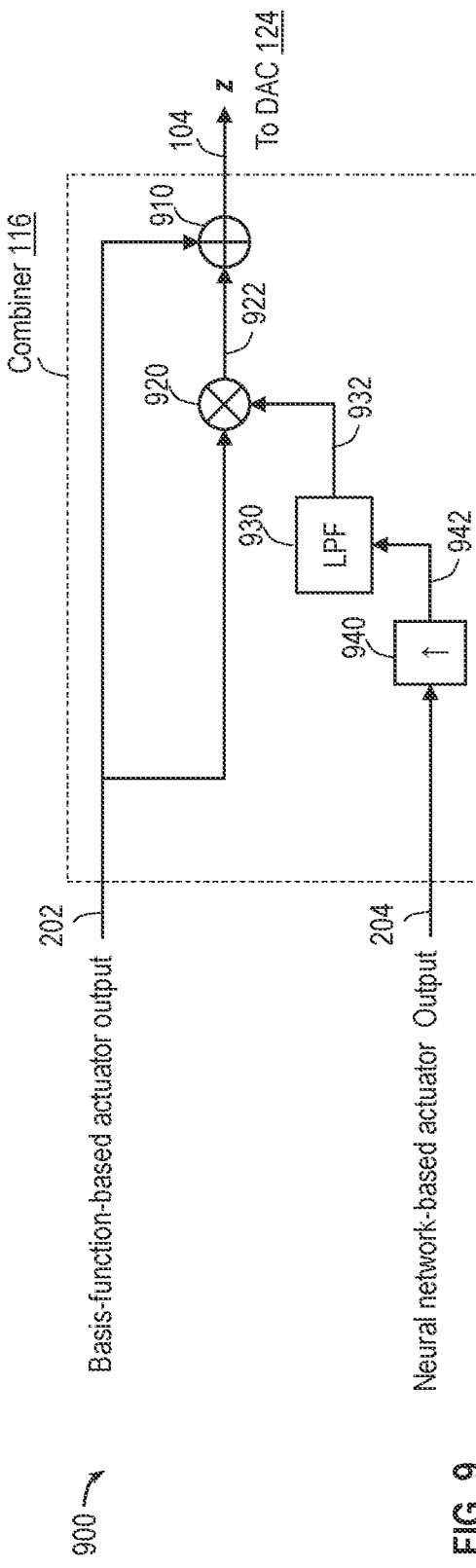
FIG. 9 provides a schematic illustration of an exemplary arrangement for a combiner in a hybrid basis function, neural network-based DPD, according to some embodiments of the present disclosure.
Figure 10:
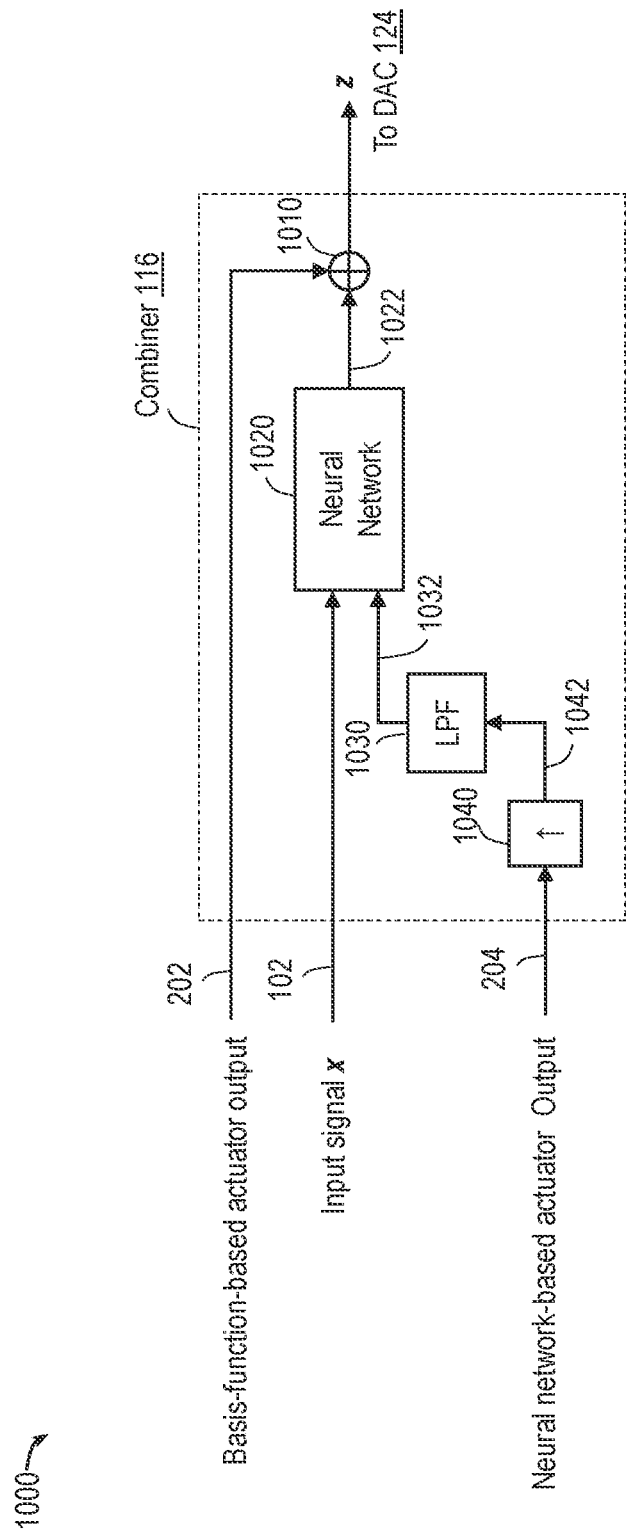
FIG. 10 provides a schematic illustration of an exemplary arrangement for a combiner in a hybrid basis function, neural network-based DPD, according to some embodiments of the present disclosure.

As discussed above, the combiner 116 used for combining outputs of the basis-function-based actuator 112 and outputs of the neural network-based actuator 114 shown in FIGS. 2 and 6-7 can have various structures. FIG. 6 illustrates one example structure for the combiner 116. FIGS. 8-10 illustrate other variations of combiner structure.

FIG. 8 provides a schematic illustration of an exemplary arrangement 800 for combiner in a hybrid basis function, neural network-based DPD, according to some embodiments of the present disclosure. For example, the combiner 116 in the DPD circuit 110 can be arranged using the arrangement 800. As shown in FIG. 8, the combiner 116 may include a summing circuit 810, a multiplication circuit 820, a low-pass filter (LPF) circuit 830, and an upsampling circuit 840.

In the arrangement 800, the upsampling circuit 840 may upsample the signal 204 output by the neural network-based actuator 114, for example, according to a downsampling performed at the neural network-based actuator 114 as discussed above. As an example, if the neural network-based actuator 114 operates at half the full signal sampling rate (of the input signal 102 x), then the upsampling circuit 840 may upsample the output signal 204 by 2 so that the upsampled signal 842 may be at the same full signal sampling rate. The LPF circuit 830 may pass the upsampled signal 842 through an LPF. The multiplication circuit 820 may multiply the input signal 102 x with the filtered signal 832 to provide a signal 822. The summing circuit 810 may sum the signal 822 with the signal 202 output by the basis-function-based actuator 112 to generate a predistorted signal 104 z.

While not shown in FIG. 8, the arrangement 800 can include delay circuitries similar to the delay circuits 710, 712, and/or 714 to time-align the signals 102 and 832 prior to the multiplication at the multiplication circuit 820 and/or time-align the signals 202 and 822 prior to the summing at the summing circuit 810. Further, in some examples, the upsampling operation can be optionally, for example, when the neural network-based actuator 114 operates at the same rate as the basis-function-based actuator 112.

FIG. 9 provides a schematic illustration of an exemplary arrangement 900 for a combiner in a hybrid basis function, neural network-based DPD, according to some embodiments of the present disclosure. For example, the combiner 116 in the DPD circuit 110 can be arranged using the arrangement 900. As shown in FIG. 9, the combiner 116 may include a summing circuit 910, a multiplication circuit 920, an LPF circuit 930, and an upsampling circuit 940 substantially similar to the arrangement 800. However, in the arrangement 900, the combiner 116 does not utilize the input signal 102 x to generate the predistorted signal 104 z.

For example, the upsampling circuit 940 may upsample the signal 204 output by the neural network-based actuator 114, for example, according to a downsampling performed at the neural network-based actuator 114 as discussed above. The LPF circuit 930 may pass the upsampled signal 942 through an LPF. The multiplication circuit 920 may multiply the signal 202 with the filtered signal 932 to provide a signal 922. The summing circuit 910 may sum the signal 922 with the signal 202 output by the basis-function-based actuator 112 to generate a predistorted signal 104 z.

While not shown in FIG. 9, the arrangement 900 can include delay circuitries similar to the delay circuits 710, 712, and/or 714 to time-align the signals 932 and 202 prior to the multiplication at the multiplication circuit 920 and/or time-align the signals 922 and 202 prior to the summation at the summing circuit 910. Further, in some examples, the upsampling operation can be optionally, for example, when the neural network-based actuator 114 operates at the same rate as the basis-function-based actuator 112.

FIG. 10 provides a schematic illustration of an exemplary arrangement 1000 for a combiner in a hybrid basis function, neural network-based DPD, according to some embodiments of the present disclosure. For example, the combiner 116 in the DPD circuit 110 can be arranged using the arrangement 1000. As shown in FIG. 10, the combiner 116 may include a summing circuit 1010, a neural network 1020, an LPF circuit 1030, and an upsampling circuit 1040.

In the arrangement 1000, the upsampling circuit 1040 may upsample the signal 204 output by the neural network-based actuator 114, for example, according to a downsampling performed at the neural network-based actuator 114 as discussed above. The LPF circuit 1030 may pass the upsampled signal 1042 through an LPF. The neural network 1020 (e.g., executed by a neural network processor or accelerator such as the accelerator 670 of FIG. 6, the accelerator 760 of FIG. 7, and/or the neural net processor core 1240 of FIG. 12) may process the upsampled signal 1032 and the input signal 102 x to provide a signal 1022. The neural network 1020 may include weights trained to combine outputs of the neural network-based actuator 114 with the input signal 102 x. The summing circuit 1010 may sum the signal 1022 with the signal 202 output by the basis-function-based actuator 112 to generate a predistorted signal 104 z.

While not shown in FIG. 10, the arrangement 1000 can include delay circuitries similar to the delay circuits 710, 712, and/or 714 to time-align the signals 1032 and 102 prior to the processing by the neural network 1020 and/or time-align the signals 1022 and 202 prior to the summing at the summing circuit 1010. Further, in some examples, the upsampling operation can be optionally, for example, when the neural network-based actuator 114 operates at the same rate as the basis-function-based actuator 112.

In general, the combiner 116 can combine the input signal x, the signal 202 output by the basis-function-based actuator 112, and/or the signal 204 output by the neural network-based actuator 114 to generate a predistorted signal 104 z. In some aspects, the combiner 116 can upsample and/or filter the output signal 204 output by the neural network-based actuator 114 prior to the combining. Additionally or alternatively, the combiner 116 can multiply the signal 204 output by the neural network-based actuator 114 with the input signal 102 x prior to the combining. Additionally or alternatively, the combiner 116 can multiply the signal 204 output by the neural network-based actuator 114 with the signal 202 output by the basis-function-based actuator 112 prior to the combining. Additionally or alternatively, the combiner 116 can pass the 204 and/or the input signal 102 x through a neural network prior to the combining.

FIG. 11 provides a schematic illustration of an exemplary PA state estimation and prediction implementation 1100 for a hybrid basis function, neural network-based DPD, according to some embodiments of the present disclosure. For example, the neural network-based actuator 114 of the DPD circuit 110 may be implemented as shown in the implementation 1100. As shown in FIG. 11, the neural network-based actuator 114 may include a PA state estimation phase 1102 and PA state prediction phase 1104. The neural network-based actuator 114 may include an estimation neural network model 1116 and a prediction neural network 1126. In some aspects, the estimation neural network model 1116 and the prediction neural network model 1126 may be executed by a neural net processor or accelerator (e.g., the accelerator 670 of FIG. 6, the accelerator 760 of FIG. 7, and/or the neural net processor core 1240 of FIG. 12).

During the PA state estimation phase 1102, the neural network-based actuator 114 may utilize an estimation neural network model 1116 for PA state estimation. For example, the neural network-based actuator 114 may estimate a PA state 1118 based on an input signal 102 x (e.g., digital baseband I/Q signal carrying data for transmission by the PA 130) and a feedback signal 151 y' indicative of an output of the PA 130. The neural network-based actuator 114 may perform one or more stages of transformation 1110 and/or downsampling 1112 on the input signal 102 x and the feedback signal 151 y' and provide the transformed and/or downsampled signal 1114 to the estimation neural network model 1116 for processing. The estimation neural network model 1116 may include a plurality of neural network layers (e.g., including an input layer, one or more hidden layers, and an output layer), each with a set of weights, and the transformed and/or downsampled signal 1114 may be passed through each of the layers for processing to provide the estimated PA state 1118.

During the PA state prediction phase 1104, the neural network-based actuator 114 may utilize prediction neural network model 1126 for PA state prediction. For example, the neural network-based actuator 114 may predict a PA state 1128 based on an input signal 102 x (e.g., digital baseband I/Q signal carrying data for transmission by the PA 130). The neural network-based actuator 114 may perform one or more stages of transformation 1120 and/or downsampling 1122 on the input signal 102 x and provide the transformed and/or downsampled signal 1124 to the prediction neural network model 1126 for processing. The prediction neural network model 1126 may include a plurality of neural network layers (e.g., including an input layer, one or more hidden layers, and an output layer), each with a set of weights, and the transformed and/or downsampled signal 1124 may be passed through each of the layers for processing to provide the predicted PA state 1128.

In some aspects, the neural network-based actuator 114 may switch between the PA state estimation phase 1102 and the PA state prediction phase 1104 based on an availability of the feedback signal 151 y'. In this regard, the neural network-based actuator 114 may select between the estimation neural network model 1116 or the prediction neural network model 1126 based on an availability of the feedback signal 151 y'. For example, if the feedback signal 151 y' (observation) is available, the neural network-based actuator 114 may select the estimation neural network model 1116. If, however, there is a lack of availability of the feedback signal 151 y', the neural network-based actuator 114 may select the prediction neural network model 1126, Further, in some aspects, the neural network-based actuator 114 may include a shared storage 1130 (e.g., memory) to store state information associated with the estimation neural network model 1116 and/or the prediction neural network model 1126. The state information can be fed back to the estimation neural network model 1116 and/or the prediction neural network model 1126 for processing to generate respective PA states. The neural network-based actuator 114 may further include a delay circuit 1132 to delay the PA state information prior to processing by the estimation neural network model 1116 and/or the prediction neural network model 1126. As an example, the estimation neural network model 1116 may process the transformed and/or downsampled signal 1114 and previous state information 1134 (e.g., a previous estimate PA state 1118 and/or a previous predicted PA state 1128) to output a new estimated PA state 1118. Subsequently, the state information at the shared storage 1130 can be updated with the new estimated PA state 1118. Similarly, the prediction neural network model 1126 may process the transformed and/or downsampled signal 1124 and previous state information 1134 (e.g., a previous estimate PA state 1118 and/or a previous predicted PA state 1128) to output a new predicted PA state 1128. Subsequently, the state information at the shared storage 1130 can be updated with the new predicted PA state 1128.

Stated differently, when the feedback signal 151 y' (observation) is not available, for example, due to duty-cycling at the observation receiver (e.g., the receiver circuit 150), the neural network-based actuator 114 may utilize the prediction neural network model 1126 to predict a further PA state according to the input signal 102 x and previously state information 1134. On the other hand, when the feedback signal 151 y' (observation) is available, the neural network-based actuator 114 may utilize the estimation neural network model 1116 to estimate a future PA state according to the input signal 102 x and feedback signal 151 y'. In some examples, the estimation neural network model 1116 may estimate the future PA state further based on previous state information 1134. In general, the estimation neural network model 1116 and the prediction neural network model 1126 may run in an alternating manner depending on the availability of the feedback signal 151 y'.

In some aspects, the neural network-based actuator 114 can include further processing stages after the estimation neural network model 1116 to process the PA state 1118 to generate an estimated PA state 1119. Similarly, the neural network-based actuator 114 can include further processing stages after the prediction neural network model 1126 to process the PA state 1128 to generate a predicted PA state 1129.

While FIG. 11 illustrates two separate paths for performing operations during the PA state estimation phase 1102 and the PA state prediction phase 1104, the neural network-based actuator 114 can be implemented in any suitable ways, for example, sharing at least some hardware blocks and circuits.

Figure 12:
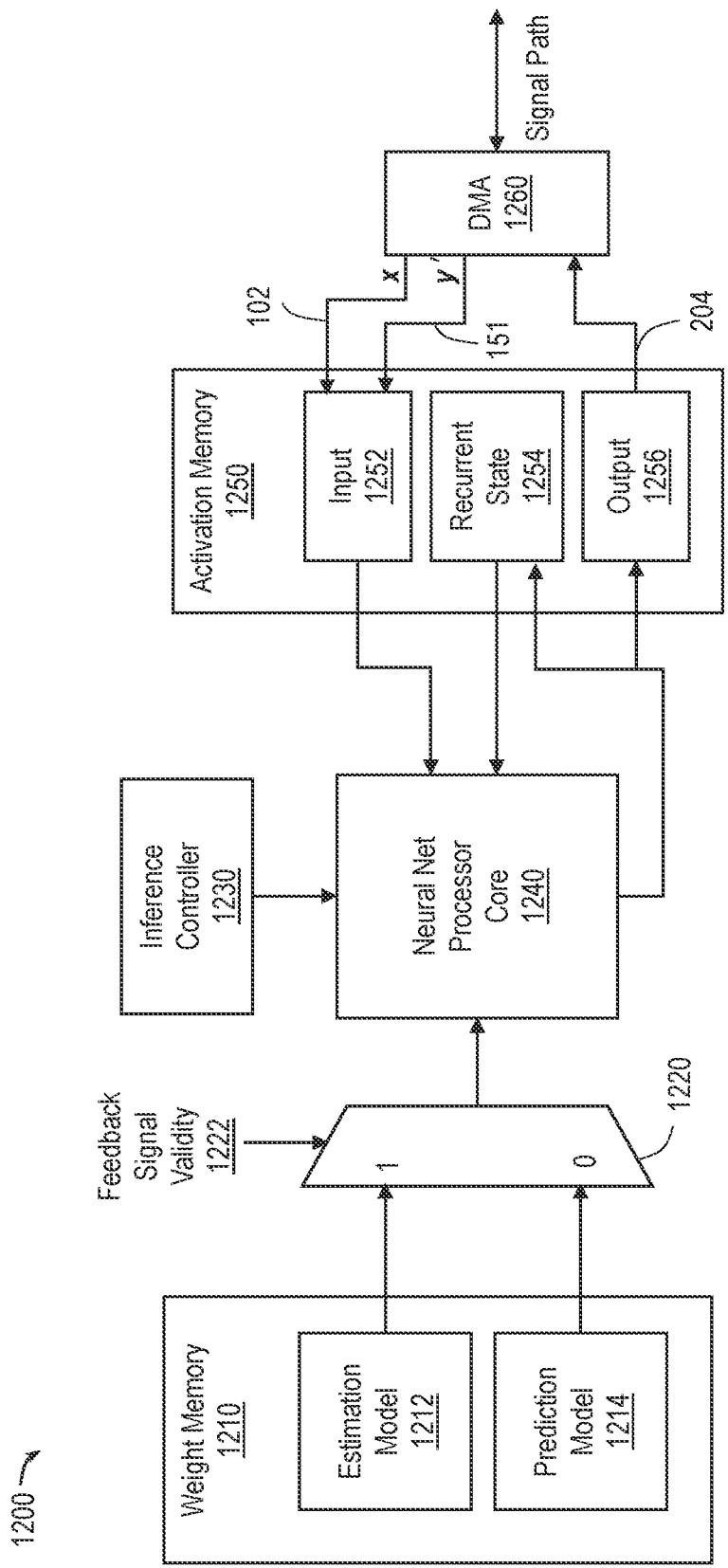
FIG. 12 provides a schematic illustration of an exemplary hardware architecture for a neural network-based actuator in a hybrid basis function, neural network-based DPD, according to some embodiments of the present disclosure.

FIG. 12 provides a schematic illustration of an exemplary hardware architecture 1200 for a neural network-based actuator in a hybrid basis function, neural network-based DPD, according to some embodiments of the present disclosure. The architecture 1200 may be used in conjunction with the implementation 1100 of FIG. 11. For example, the neural network-based actuator 114 of the DPD circuit 110 may be implemented using the implemented using the implementation 1100 and the architecture 1200. As shown in FIG. 12, the architecture 1200 may include a weight memory 1210, a multiplexer 1220, an inference controller 1230, a neural net processor core 1240, an activation memory 1250, and a direct memory access (DMA) controller 1260.

The weight memory 1210 may be any suitable volatile or non-volatile memory. Some examples of memory may include double data rate random access memory (DDR RAM), synchronous RAM (SRAM), dynamic RAM (DRAM), flash, read-only memory (ROM), etc. The activation memory 1250 may be configured to store estimation neural network model information 1212 and prediction neural network model information 1214. For instance, the estimation neural network model information 1212 may include weight parameters and/or any other information associated with the neural network layers of the estimation neural network model 1116. Similarly, the prediction neural network model information 1214 may include weight parameters and/or any other information associated with the neural network layers of the prediction neural network model 1126.

The multiplexer 1220 may select between the estimation neural network model information 1212 or the prediction neural network model information 1214 stored at the memory 1210 based on a feedback signal (or observation signal) validity indication signal 1222. For instance, the feedback signal validity indication signal 1222 indicates that a feedback signal 151 $y'$ is valid (or available), the multiplexer 1220 may select the estimation neural network model information 1212 and output the estimation neural network model information 1212 to the neural net processor core 1240. If, however, the feedback signal validity indication signal 1222 indicates that a feedback signal 151 $y'$ is invalid (or unavailable), the multiplexer 1220 may select the prediction neural network model information 1214 and output the prediction neural network model information 1214 to the neural net processor core 1240.

The activation memory 1250 may be any suitable volatile memory, for example, DDR RAM, SRAM, DRAM, etc. The activation memory 1250 may be configured to store input data 1252, recurrent state information 1254, and output data 1256. For instance, the input data 1252 may include captures of an input signal 102 $x$ (to be predistorted by a hybrid basis function, neural network-based DPD as disclosed herein prior to transmission by a PA 130) and captures of a feedback signal 151 $y'$ (indicative of an output of the PA 130). The recurrent state information 1254 may include previous PA states (e.g., the PA states 1118, 1119) estimated by a neural network defined by the estimation neural network model information 1212 and/or previous PA states (e.g., the PA states 1128, 1129) predicted by a neural network defined by the prediction neural network model information 1214. The output data 1256 may include an output signal 204 generated by the neural network-based actuator 114. The output signal 204 may be used to generate a predistorted signal 104 $z$ for the PA 130 as disclosed herein.

The DMA controller 1260 may be a hardware device configured to provide memory access (e.g., for streaming data) between the neural net processor core 1240 and other elements in the hybrid basis function, neural network-based DPD circuit 110. For example, the signal path may be coupled to the basis-function-based actuator 112 within the DPD circuit 110 and the combiner 116 as shown in FIGS. 6-10. In some aspects, the DMA controller 1260 may transfer the input data 1252 from DPD capture buffer (e.g., the capture buffer 660) to the activation memory 1250. In some aspects, the signal path can include other circuits such as downsampling circuits (e.g., downsampling circuits 682, 740, 1112), upsampling circuits (e.g., upsampling circuits 680, 840, 940, 1040), filtering circuits (e.g., LPF circuits 830, 930, 1030), multiplication circuits (e.g., multiplication circuits 820, 920), neural network processor (e.g., the accelerator 670 of FIG. 6 and/or the accelerator 760 of FIG. 7, and/or the neural net processor 1240), summing circuits (e.g., summing circuits 630, 810, 910, 1010), etc.

The neural net processor core 1240 may be configured to perform neural network-specific operations (e.g., convolutions, ReLU operations, biasing operations, etc.). The neural net processor core 1240 may process an input signal 102 $x$ (a block of digital I/Q samples), and/or a feedback signal 151 $y'$ (a block of digital I/Q samples) captured at the input data 1252 using the estimation neural network model information 1212 or the prediction neural network model information 1214 according to the selection at the multiplexer 1220. For instance, when the feedback signal 151 $y'$ is available, the neural net processor core 1240 may process the input signal 102 $x$ and the feedback signal 151 $y'$ using the estimation neural network model information 1212 to generate an estimated PA state (a future PA state). When there is a lack of availability of the feedback signal 151 $y'$ at the input data 1252, the neural net processor core 1240 may process the input signal 102 $x$ using the prediction neural network model information 1214 to generate a predicted PA state (a future PA state).

The inference controller 1230 may be configured to trigger the neural net processor core 1240 inference at a given cadence. For example, the inference controller 1230 can synchronize the inputs, outputs, and/or operations of the neural net processor core 1240 so that the data can be streamed between the neural network-based actuator 114 and the combiner 116 and/or the basis-function-based actuator 112. Further, the inference control 1230 can inform the neural net processor core 1240 of the neural network model (e.g., the estimation neural network model or the prediction neural network model) to execute. For example, in some instances, the inference controller 1230 can provide other information associated with PA state estimation and/or prediction to the neural net processor core 1240.

In general, the weight memory 1210, the multiplexer 1220, the inference controller 1230, the neural net processor core 1240, the activation memory 1250, and the DMA controller 1260 may be arranged in any suitable way. In some aspects, the weight memory 1210, the multiplexer 1220, the inference controller 1230, the neural net processor core 1240, the activation memory 1250, and/or the DMA controller 1260 may be implemented as part of a neural network hardware accelerator (e.g., the accelerator 670 of FIG. 6 and/or the accelerator 760 of FIG. 7).

While FIG. 12 is discussed in the context of a neural network-based actuator 114 utilizing an estimation neural network model and a prediction neural network model, aspects are not limited thereto. For example, the architecture 1200 can be used by a neural network-based actuator 114 utilizing any suitable number of neural networks, where parameters associated with respective neural network(s) may be stored in the weighted memory 1210 and the neural net processor 1240 may process inputs using respective parameters. For instance, the architecture 1200 can be used for the neural network-based actuator 114 in the arrangements 200, 300, 400, and/or 500 discussed above.

FIG. 13 provides a flow diagram illustrating a method 1300 for performing hybrid basis function, neural network-based DPD, according to some embodiments of the present disclosure. The method 1300 may be implemented by a hybrid basis function, neural network-based DPD to predistort an input signal (e.g., the input signal 102 *x*) to a nonlinear component (e.g., the PA 130) as discussed above with reference to FIGS. 1-12. Operations are illustrated once each and in a particular order in FIG. 13, but the operations may be performed in parallel, reordered, and/or repeated as desired.

At 1302, a first signal (e.g., the signal 202) may be generated based on a set of basis functions, DPD coefficients, and at least one of the input signal or a feedback signal (e.g., the feedback signal 151 *y'*) indicative of an output of the nonlinear component using first actuation circuitry (e.g., the basis-function-based actuator 112). The set of basis functions and the DPD coefficients may be associated with a first nonlinear characteristic of the nonlinear component.

At 1304, a second signal (e.g., the signal 204) may be generated based on a neural network (e.g., the neural network model 610, the neural network 1020, the estimation neural network model 1116, the prediction neural network model 1126, the estimation neural network model information 1212, and/or the prediction neural network model information 1214) and at least one of the input signal or the feedback signal using second actuator circuitry (e.g., neural network-based actuator 114). The neural network is associated with a second nonlinear characteristic of the nonlinear component.

At 1306, a predistorted signal (e.g., the predistorted signal 104 *z*) may be generated based on the first signal and the second signal.

In some aspects, the first and second actuator circuitry may be arranged in a parallel configuration. Accordingly, the generating the first signal at 1302 may includer applying the set of basis functions and the DPD coefficients to at least one of the input signal or the feedback signal. Further, the generating the second signal at 1304 may include applying the neural network to at least one of the input signal or the feedback signal. In some aspects, the generating the predistorted signal at 1306 may include combining the first signal generated by the first actuator circuitry and the second signal generated by the second actuator circuitry, for example, as discussed above with reference to FIGS. 2, 6, 7-10. In some aspects, the generating the predistorted signal at 1306 may further include combining the input signal with the first signal generated by the first actuator circuitry and the second signal generated by the second actuator circuitry, for example, as discussed above with reference to FIGS. 8-10. In some aspects, the generating the predistorted signal at 1306 may include updating a parameter of the first actuator circuitry based the second signal of the second actuator circuitry, for example, as discussed above with reference to FIG. 3.

In some aspects, the first and second actuator circuitry may be arranged in a cascaded configuration. Accordingly, in one aspect, the generating first signal at 1302 may include applying the set of basis functions and the DPD coefficients to at least one of the input signal or the feedback signal, and the generating second signal at 1304 may include applying the neural network to the first signal generated by the first actuator circuitry, for example, as discussed above with reference to FIG. 5. In another aspect, the generating second signal at 1304 may include applying the neural network to at least one of the input signal or the feedback signal, and the generating first signal at 1302 may include applying the set of basis functions and the DPD coefficients to the first signal generated by the first actuator circuitry, for example, as discussed above with reference to FIG. 4.

In some aspects, the neural network may include an estimation neural network model (e.g., the model 1116) and a prediction neural network model (e.g., the model 1126), for example, as discussed above with reference to FIGS. 11-12. Accordingly, the generating the second signal at 1304 may include selecting between the estimation neural network model or the prediction neural network model based on whether the feedback signal is valid. The generating the second signal at 1304 may further include applying the estimation neural network model to the input signal and the feedback signal responsive to the feedback signal being valid. The generating the second signal at 1304 may further include applying the prediction neural network model to the input signal responsive to the feedback signal being invalid.

EXAMPLES

Example 1 provides an apparatus for a radio frequency (RF) transceiver. The apparatus includes a digital predistortion (DPD) actuator to receive an input signal associated with a nonlinear component of the RF transceiver and output a predistorted signal, where the DPD actuator includes a basis-function-based actuator to perform a first DPD operation using a set of basis functions associated with a first nonlinear characteristic of the nonlinear component; and a neural network-based actuator to perform a second DPD operation using a first neural network associated with a second nonlinear characteristic of the nonlinear component, where the predistorted signal is based on a first output signal of the basis-function-based actuator and a second output signal of the neural network-based actuator.

Example 2 provides an apparatus according to one or more of the preceding and/or following examples, where the basis-function-based actuator performs the first DPD operation by processing at least one of the input signal or a feedback signal indicative of an output of the nonlinear component using the set of basis functions to generate the first output signal.

Example 3 provides an apparatus according to one or more of the preceding and/or following examples, where the basis-function-based actuator performs the first DPD operation further by applying a transformation operation to the at least one of the input signal or the feedback signal.

Example 4 provides an apparatus according to one or more of the preceding and/or following examples, where the neural network-based actuator performs the second DPD operation by updating a parameter of the basis-function-based actuator based on the second output signal of the neural network-based actuator; and the basis-function-based actuator performs the first DPD operation further by generating the first output signal further using the updated parameter.

Example 5 provides an apparatus according to one or more of the preceding and/or following examples, where the basis-function-based actuator performs the first DPD operation by processing the second output signal of the neural network-based actuator using the set of basis functions to generate the first output signal.

Example 6 provides an apparatus according to one or more of the preceding and/or following examples, where the neural network-based actuator performs the second DPD operation by processing at least one of the input signal or a feedback signal indicative of an output of the nonlinear component using the first neural network to generate the second output signal.

Example 7 provides an apparatus according to one or more of the preceding and/or following examples, where the neural network-based actuator performs the second DPD operation further by applying a transformation operation to the at least one of the input signal or the feedback signal. In an example, the transformation includes generating features based on at least one an analog gain setting, a temperature, or a symbol power associated with the feedback signal.

Example 8 provides an apparatus according to one or more of the preceding and/or following examples, where the neural network-based actuator performs the second DPD operation further by downsampling the at least one of the input signal or the feedback signal.

Example 9 provides an apparatus according to one or more of the preceding and/or following examples, where the neural network-based actuator performs the second DPD operation by processing the first output signal of the basis-function-based actuator using the first neural network to generate the second output signal.

Example 10 provides an apparatus according to one or more of the preceding and/or following examples, where the neural network-based actuator performs the second DPD operation further by processing the input signal using the first neural network.

Example 11 provides an apparatus according to one or more of the preceding and/or following examples, where the DPD actuator further includes a combiner to combine the first output signal of the basis-function-based actuator with the second output signal of the neural network-based actuator to generate the predistorted signal.

Example 12 provides an apparatus according to one or more of the preceding and/or following examples, where the combiner further combines the input signal with the first output signal of the basis-function-based actuator and the second output signal of the neural network-based actuator to generate the predistorted signal.

Example 13 provides an apparatus according to one or more of the preceding and/or following examples, where the combiner further multiplies the second output signal of the neural network-based actuator with the input signal or the first output signal of the basis-function-based actuator before combining the first output signal of the basis-function-based actuator with the second output signal of the neural network-based actuator.

Example 14 provides an apparatus according to one or more of the preceding and/or following examples, where the combiner further applies a transformation operation to the second output signal of the neural network-based actuator before combining the first output signal of the basis-function-based actuator with the second output signal of the neural network-based actuator.

Example 15 provides an apparatus according to one or more of the preceding and/or following examples, where the transformation operation applied to the second output signal of the neural network-based actuator is associated with at least one of upsampling, filtering, signal alignment, or a second neural network different from the first neural network.

Example 16 provides an apparatus according to one or more of the preceding and/or following examples, where the DPD actuator further includes a combiner to process, using a second neural network different from the first neural network, at least one of the input signal or the second output signal of the neural network-based actuator to generate a third output signal; and combine the third output signal with the first output signal of the basis-function-based actuator to generate the predistorted signal.

Example 17 provides an apparatus according to one or more of the preceding and/or following examples, where the combiner further applies a transformation operation to the second output signal of the neural network-based actuator.

Example 18 provides an apparatus according to one or more of the preceding and/or following examples, where the transformation operation applied to the second output signal of the neural network-based actuator is associated with at least one of an upsampling operation or a filtering operation.

Example 19 provides an apparatus according to one or more of the preceding and/or following examples, where the neural network-based actuator performs the second DPD operation further using a second neural network, and where the first neural network and the second neural network operate at different sampling rates. For instance, the basis-function-based actuator performs the first DPD operation at a first sampling rate and the neural network-based actuator performs the second DPD operation at a second sampling rate different from the first sampling rate.

Example 20 provides an apparatus for a radio frequency (RF) transceiver. The apparatus includes a digital predistortion (DPD) actuator to perform DPD on an input signal associated with a nonlinear component of the RF transceiver, where the DPD actuator includes a first actuator to process the input signal based on a set of basis functions and DPD coefficients to generate a first output signal; and a second actuator to process at least one of the input signal or a feedback signal indicative of an output of the nonlinear component using one or more neural networks to generate a second output signal; and a combiner to generate a predistorted signal based on the first output signal and the second output signal, where the set of basis functions, the DPD coefficients, and the one or more neural networks are each associated with one or more nonlinear characteristics of the nonlinear component.

Example 21 provides an apparatus according to one or more of the preceding and/or following examples, where the second actuator selects between a first neural network and a second neural network of the one or more neural networks based on an availability of the feedback signal.

Example 22 provides an apparatus according to one or more of the preceding and/or following examples, where the second actuator generates the second output signal by using the first neural network to process the input signal and the feedback signal, and where using the first neural network is based on the availability of the feedback signal.

Example 23 provides an apparatus according to one or more of the preceding and/or following examples, where the second actuator generates the second output signal by using the second neural network to process the input signal, and where using the second neural network is based on a lack of availability of the feedback signal.

Example 24 provides an apparatus according to one or more of the preceding and/or following examples, where the second actuator generates the second output signal by using the selected one of the first neural network or the second neural network to process the at least one of the input signal or the feedback signal; and previous state information associated with at least one of the first neural network or the second neural network; and updates, based on the second output signal, state information associated with at least one of the first neural network or the second neural network.

Example 25 provides an apparatus according to one or more of the preceding and/or following examples, further including memory to store parameters associated with the one or more neural networks; and a neural net processor to perform neural network-specific operations; where the second actuator processes the at least one of the input signal or the feedback signal by using the neural net processor and the stored parameters.

Example 26 provides a method for performing digital predistortion (DPD) to predistort an input signal for a nonlinear component. The method includes generating, using first actuator circuitry, a first signal based on a set of basis functions, DPD coefficients, and at least one of the input signal or a feedback signal indicative of an output of the nonlinear component, where the set of basis functions and the DPD coefficients are associated with a first nonlinear characteristic of the nonlinear component; generating, using second actuator circuitry, a second signal based on a neural network and at least one of the input signal or the feedback signal, where the neural network is associated with a second nonlinear characteristic of the nonlinear component; and generating a predistorted signal based on the first signal and the second signal.

Example 27 provides a method according to one or more of the preceding and/or following examples, where the generating the first signal includes applying the set of basis functions and the DPD coefficients to at least one of the input signal or the feedback signal; and the generating the second signal includes applying the neural network to at least one of the input signal or the feedback signal.

Example 28 provides a method according to one or more of the preceding and/or following examples, where the generating the predistorted signal includes combining the first signal generated by the first actuator circuitry and the second signal generated by the second actuator circuitry.

Example 29 provides a method according to one or more of the preceding and/or following examples, where the generating the predistorted signal further includes combining the input signal with the first signal generated by the first actuator circuitry and the second signal generated by the second actuator circuitry.

Example 30 provides a method according to one or more of the preceding and/or following examples, where the generating the predistorted signal includes updating a parameter of the first actuator circuitry based the second signal of the second actuator circuitry.

Example 31 provides a method according to one or more of the preceding and/or following examples, where the generating first signal includes applying the set of basis functions and the DPD coefficients to at least one of the input signal or the feedback signal; and the generating second signal includes applying the neural network to the first signal generated by the first actuator circuitry.

Example 32 provides a method according to one or more of the preceding and/or following examples, where the generating second signal includes applying the neural network to at least one of the input signal or the feedback signal; and the generating first signal includes applying the set of basis functions and the DPD coefficients to the first signal generated by the first actuator circuitry.

Example 33 provides a method according to one or more of the preceding and/or following examples, where the neural network includes an estimation neural network model and a prediction neural network model; and the generating the second signal includes selecting between the estimation neural network model or the prediction neural network model based on whether the feedback signal is valid; applying the estimation neural network model to the input signal and the feedback signal responsive to the feedback signal being valid; and applying the prediction neural network model to the input signal responsive to the feedback signal being invalid.

Variations and Implementations

Various embodiments of performing DPD using a combination of basis-function-based actuation and neural network-based actuation are explained herein with reference to the "input signals for PAs" being drive signals for the PAs, i.e., signals generated on the basis of the input signal x, described herein. However, in other embodiments of DPD using a combination of basis-function-based actuation and neural network-based actuation, the "input signals for PAs" may be bias signals used to bias the N PAs. Thus, embodiments of the present disclosure also cover DPD arrangements including a combination of basis-function-based actuator and neural network-based actuator similar to the ones described herein and illustrated in the drawings, except that, instead of modifying the drive signals for the PAs, the DPD arrangements may be configured to modify the bias signals for the PAs, which may be done based on control signals generated by a DPD adaptation circuit (e.g., the DPD adaptation circuit, described herein), where the output of a PA is based on the bias signal used to bias the PA. In other aspects of the present disclosure, both drive signals and bias signals for PAs may be adjusted as described herein to implement of DPD using neural networks.

While some of the descriptions are provided herein with reference to PAs, in general, various embodiments of DPD including a combination of basis-function-based actuator and neural network-based actuator, presented herein, are applicable to amplifiers other than PAs, such as low-noise amplifiers, variable gain amplifiers, etc., as well as to nonlinear electronic components of RF transceivers (i.e., components that may exhibit nonlinear behavior) other than amplifiers. Furthermore, while some of the descriptions are provided herein with reference to millimeter-wave/5G technologies, in general, various embodiments of DPD using neural networks, presented herein, are applicable to wireless communication systems of any technology or standard other than millimeter-wave/5G, to any wireless RF systems other than wireless communication systems, and/or to RF systems other than wireless RF systems.

While embodiments of the present disclosure were described above with references to exemplary implementations as shown in FIGS. 1-13, a person skilled in the art will realize that the various teachings described above are applicable to a large variety of other implementations.

In certain contexts, the features discussed herein can be applicable to automotive systems, safety-critical industrial applications, medical systems, scientific instrumentation, wireless and wired communications, radio, radar, industrial process control, audio and video equipment, current sensing, instrumentation (which can be highly precise), and other digital-processing-based systems.

In the discussions of the embodiments above, components of a system, such as multiplexers, multipliers, adders, delay taps, filters, converters, mixers, and/or other components can readily be replaced, substituted, or otherwise modified in order to accommodate particular circuitry needs. Moreover, it should be noted that the use of complementary electronic devices, hardware, software, etc., offer an equally viable option for implementing the teachings of the present disclosure related to applying model architecture search for hardware configurations, in various communication systems.

Parts of various systems for using hybrid basis function, neural network-based DPD techniques as proposed herein can include electronic circuitry to perform the functions described herein. In some cases, one or more parts of the system can be provided by a processor specially configured for carrying out the functions described herein. For instance, the processor may include one or more application specific components, or may include programmable logic gates which are configured to carry out the functions describe herein. The circuitry can operate in analog domain, digital domain, or in a mixed-signal domain. In some instances, the processor may be configured to carrying out the functions described herein by executing one or more instructions stored on a non-transitory computer-readable storage medium.

In one example embodiment, any number of electrical circuits of the present figures may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of DSPs, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the electrical circuits of the present figures may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often RF functions: all of which may be provided on a single chip substrate. Other embodiments may include a multi-chip-module (MCM), with a plurality of separate ICs located within a single electronic package and configured to interact closely with each other through the electronic package.

It is also imperative to note that all of the specifications, dimensions, and relationships outlined herein (e.g., the number of components of the apparatuses, DPD arrangements, and/or RF transceiver shown in FIGS. 1-12) have only been offered for purposes of example and teaching only. Such information may be varied considerably without departing from the spirit of the present disclosure, or the scope of the appended claims. It should be appreciated that the system can be consolidated in any suitable manner. Along similar design alternatives, any of the illustrated circuits, components, modules, and elements of the present figures may be combined in various possible configurations, all of which are clearly within the broad scope of this specification. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments. Also, as used herein, including in the claims, "or" as used in a list of items (for example, a list of items prefaced by a phrase such as "at least one of" or "one or more of") indicates an inclusive list such that, for example, a list of [at least one of A, B, or C] means A or B or C or AB or AC or BC or ABC (i.e., A and B and C).

Various aspects of the illustrative embodiments are described using terms commonly employed by those skilled in the art to convey the substance of their work to others skilled in the art. For example, the term "connected" means a direct electrical connection between the things that are connected, without any intermediary devices/components, while the term "coupled" means either a direct electrical connection between the things that are connected, or an indirect connection through one or more passive or active intermediary devices/components. In another example, the term "circuit" means one or more passive and/or active components that are arranged to cooperate with one another to provide a desired function. Also, as used herein, the terms "substantially," "approximately," "about," etc., may be used to generally refer to being within +/−20% of a target value, e.g., within +/−10% of a target value, based on the context of a particular value as described herein or as known in the art.

Numerous other changes, substitutions, variations, alterations, and modifications may be ascertained to one skilled in the art and it is intended that the present disclosure encompass all such changes, substitutions, variations, alterations, and modifications as falling within the scope of the examples and appended claims. Note that all optional features of the apparatus described above may also be implemented with respect to the method or process described herein and specifics in the examples may be used anywhere in one or more embodiments.

The invention claimed is:

1. An apparatus for a radio frequency (RF) transceiver, the apparatus comprising:
a digital predistortion (DPD) actuator configured to receive an input signal associated with a nonlinear component of the RF transceiver and output a predistorted signal, wherein the DPD actuator comprises:
a first actuator configured to perform a first DPD operation using a set of basis functions associated with a first nonlinear characteristic of the nonlinear component; and
a second actuator configured to perform a second DPD operation using a first neural network associated with a second nonlinear characteristic of the nonlinear component,
wherein the predistorted signal is based on a first output signal of the first actuator and a second output signal of the second actuator.

2. The apparatus of claim 1, wherein the first actuator is configured to perform the first DPD operation by processing at least one of the input signal or a feedback signal indicative of an output of the nonlinear component using the set of basis functions to generate the first output signal.

3. The apparatus of claim 2, wherein:
the second actuator is configured to perform the second DPD operation by updating a parameter of the first actuator based on the second output signal of the second actuator; and
the first actuator is configured to perform the first DPD operation further by generating the first output signal further using the updated parameter.

4. The apparatus of claim 1, wherein the first actuator is configured to perform the first DPD operation by processing the second output signal of the second actuator using the set of basis functions to generate the first output signal.

5. The apparatus of claim 1, wherein the second actuator is configured to perform the second DPD operation by processing at least one of the input signal or a feedback signal indicative of an output of the nonlinear component using the first neural network to generate the second output signal.

6. The apparatus of claim 1, wherein the second actuator is configured to perform the second DPD operation by processing the first output signal of the first actuator using the first neural network to generate the second output signal.

7. The apparatus of claim 1, wherein the DPD actuator further comprises a combiner configured to combine the first output signal of the first actuator with the second output signal of the second actuator to generate the predistorted signal.

8. The apparatus of claim 7, wherein the combiner is further configured to combine the input signal with the first output signal of the first actuator and the second output signal of the second actuator to generate the predistorted signal.

9. The apparatus of claim 7, wherein the combiner is further configured to apply a transformation operation to the second output signal of the second actuator before combining the first output signal of the first actuator with the second output signal of the second actuator.

10. The apparatus of claim 1, wherein the DPD actuator further comprises a combiner configured to:
process, using a second neural network different from the first neural network, at least one of the input signal or the second output signal of the second actuator to generate a third output signal; and
combine the third output signal with the first output signal of the first actuator to generate the predistorted signal.

11. An apparatus for a radio frequency (RF) transceiver, the apparatus comprising:
a digital predistortion (DPD) actuator configured to perform DPD on an input signal associated with a nonlinear component of the RF transceiver, wherein the DPD actuator comprises:
a first actuator configured to process the input signal based on a set of basis functions to generate a first output signal, wherein the set of basis functions is associated with a first nonlinear characteristic of the nonlinear component;
a second actuator configured to process at least one of the input signal or a feedback signal indicative of an output of the nonlinear component using one or more neural networks to generate a second output signal, wherein the one or more neural networks are associated with a second nonlinear characteristic of the nonlinear component; and
a combiner configured to generate a predistorted signal based on the first output signal and the second output signal.

12. The apparatus of claim 11, wherein the second actuator is configured to select, based on availability of the feedback signal, between a first neural network and a second neural network of the one or more neural networks.

13. The apparatus of claim 12, wherein the second actuator is configured to generate the second output signal by using the first neural network to process the input signal and the feedback signal, and wherein using the first neural network is based on availability of the feedback signal.

14. The apparatus of claim 12, wherein the second actuator is configured to generate the second output signal by using the second neural network to process the input signal, and wherein using the second neural network is based on a lack of availability of the feedback signal.

15. The apparatus of claim 12, wherein the second actuator is configured to generate the second output signal by using the selected one of the first neural network or the second neural network to process:
the at least one of the input signal or the feedback signal; and
previous state information associated with at least one of the first neural network or the second neural network; and
and wherein the second actuator is further configured to update, based on the second output signal, state information associated with at least one of the first neural network or the second neural network.

16. The apparatus of claim 11, further comprising:
memory configured to store parameters associated with the one or more neural networks; and
a neural net processor configured to perform neural network-specific operations;
wherein the second actuator is configured to process the at least one of the input signal or the feedback signal by using the neural net processor and the parameters.

17. A method for performing digital predistortion (DPD), the method comprising:
generating, using first actuator circuitry, a first signal by performing a first DPD operation based on a set of basis functions associated with a first nonlinear characteristic of a nonlinear component;

generating, using second actuator circuitry, a second signal by performing a second DPD operation based on a neural network associated with a second nonlinear characteristic of the nonlinear component; and generating, based on the first signal and the second signal, a predistorted signal.

18. The method of claim 17, wherein:

the generating the first signal comprises applying the set of basis functions to at least one of an input signal associated with a nonlinear component or a feedback signal indicative of an output of the nonlinear component; and the generating the second signal comprises applying the neural network to at least one of the input signal or the feedback signal.

19. The method of claim 18, wherein the generating the predistorted signal comprises combining the first signal and the second signal.

20. The method of claim 17, wherein:

the neural network comprises an estimation neural network model and a prediction neural network model; and the generating the second signal comprises:

selecting between the estimation neural network model or the prediction neural network model based on whether a feedback signal indicative of an output of the nonlinear component is valid;

applying the estimation neural network model to an input signal associated with the nonlinear component and to the feedback signal in response to the feedback signal being valid; and applying the prediction neural network model to the input signal in response to the feedback signal being invalid.

* * * * *